US012696821B2

(12) United States Patent
Yamaguchi et al.

(10) Patent No.: US 12,696,821 B2
(45) Date of Patent: Jul. 28, 2026

(54) SEMICONDUCTOR EQUIPMENT

(71) Applicant: ROHM CO., LTD., Kyoto (JP)

(72) Inventors: Moe Yamaguchi, Kyoto (JP); Hiroaki Matsubara, Kyoto (JP); Yoshizo Osumi, Kyoto (JP); Tomohira Kikuchi, Kyoto (JP); Ryohei Umeno, Kyoto (JP); Taro Nishioka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 400 days.

(21) Appl. No.: 18/256,150

(22) PCT Filed: Nov. 29, 2021

(86) PCT No.: PCT/JP2021/043634
§ 371 (c)(1),
(2) Date: Jun. 6, 2023

(87) PCT Pub. No.: WO2022/137996
PCT Pub. Date: Jun. 30, 2022

(65) Prior Publication Data
US 2024/0112995 A1      Apr. 4, 2024

(30) Foreign Application Priority Data

Dec. 24, 2020    (JP) ................................. 2020-215310

(51) Int. Cl.
H10W 90/00        (2026.01)
H10W 70/40        (2026.01)
(Continued)

(52) U.S. Cl.
CPC ........ H10W 90/811 (2026.01); H10W 70/417 (2026.01); H10W 70/435 (2026.01);
(Continued)

(58) Field of Classification Search
CPC ........... H01L 23/49575; H01L 23/3107; H01L 23/49513; H01L 23/49517;
(Continued)

(56) References Cited

U.S. PATENT DOCUMENTS

2015/0200181 A1* 7/2015 Haga ...................... B23K 20/10
                                                      438/127
2020/0312750 A1* 10/2020 Shirai ................. H01L 23/3114

FOREIGN PATENT DOCUMENTS

JP          5-275602        10/1993
JP        2002-261187        9/2002
(Continued)

OTHER PUBLICATIONS

International Search Report issued in International Application No. PCT/JP2021/043634, Feb. 8, 2022, 3 pages.
(Continued)

*Primary Examiner* — Patricia D Valenzuela
(74) *Attorney, Agent, or Firm* — HSML P.C.

(57) ABSTRACT

A semiconductor device includes a first die pad with a first obverse surface facing in z direction, a second die pad spaced from the first die pad and including a second obverse surface facing in z direction, a first semiconductor element on the first obverse surface, a second semiconductor element on the second obverse surface, an insulating element on the first or second obverse surface and located between the first and second semiconductor elements in x direction to relay signals between the first and second semiconductor elements while electrically insulating these semiconductor elements, and a wire bonded to the first semiconductor element and the first obverse surface. The first die pad includes a first bond portion bonded to the wire, and a first opening located
(Continued)

between the first bond portion and the first semiconductor element in y direction and including an opening end in the first obverse surface.

20 Claims, 21 Drawing Sheets

(51) Int. Cl.
*H10W 74/10* (2026.01)
*H10W 72/00* (2026.01)
*H10W 72/30* (2026.01)

(52) U.S. Cl.
CPC ........ *H10W 70/464* (2026.01); *H10W 74/111* (2026.01); *H10W 72/352* (2026.01); *H10W 72/884* (2026.01); *H10W 90/736* (2026.01); *H10W 90/756* (2026.01)

(58) Field of Classification Search
CPC ... H01L 23/49558; H01L 24/29; H01L 24/32; H01L 24/48; H01L 24/73; H01L 2224/29139; H01L 2224/32245; H01L 2224/48245; H01L 2224/73265; H01L 23/49548; H01L 24/08; H01L 23/3142; H01L 23/49503; H01L 23/4952; H01L 24/49; H01L 2224/26175; H01L 2224/48137; H01L 2224/48247; H01L 2924/181; H10W 90/811; H10W 70/417; H10W 70/435; H10W 70/464; H10W 74/111; H10W 72/352; H10W 72/884; H10W 90/736; H10W 90/756; H10W 74/00; H10W 90/753; H10W 72/50; H10W 72/387; H10W 72/90; H10W 70/424; H10W 70/411; H10W 70/465; H10W 74/127

See application file for complete search history.

(56) References Cited

FOREIGN PATENT DOCUMENTS

| | | |
|---|---|---|
| JP | 2008-066553 | 3/2008 |
| JP | 2016-207714 | 12/2016 |
| JP | 2019-145829 | 8/2019 |
| WO | 2019/203139 | 10/2019 |
| WO | 2020/012957 | 1/2020 |

OTHER PUBLICATIONS

Office Action issued in corresponding German Patent Application No. 11 2021 006 152.6, Oct. 9, 2023, 14 pages w/translation.
Office Action issued in corresponding Japanese Patent Application No. 2022-572018, Jul. 29, 2025, 11 pages w/ translation.

* cited by examiner

A10

A10

7

71

75 {
751
753
752
}

51b

51

72

51

51

73 {
731 733 732
}

51

51

51

51a

76 {
761
763
762
} z1
y2
y1
z2

A10

75

563a

7

71

62b  34/31

11

33  62a

563a

76

563 (56)  52b

52

561 (56)

52

36

32

72  32

3

52

69

35

52

561 (56)

52

563 (56)

52a z1
y1 ← → y2
z2

A70

73 76 74

51a(51,2) 54 56 52a(52,2)

51(2) 52(2)

61 45 31 3(2) 35 62

53 62a 55

51(2) 52(2)

61a
61 55

51(2) 52(2)

61 11 62

63

51(2) 53 55 52(2)

64

12 13

51(2) 61 61 62 52(2)

61b 62b

51(2) 36 55 52(2)

53 4(2) 41

61 46 62

51b(51,2) 54 52b(52,2)

56

75 7 y1 x1 ← → x2 y2

SEMICONDUCTOR EQUIPMENT

TECHNICAL FIELD

The present disclosure relates to a semiconductor device.

BACKGROUND ART

A semiconductor device with an insulating element is used in an inverter device for electric vehicles (including hybrid vehicles) or home appliances. Such an inverter device may include power semiconductors such as IGBTs (Insulated Gate Bipolar Transistor) or MOSFETs (Metal Oxide Semiconductor Field Effect Transistor) in addition to the above-mentioned semiconductor device. The semiconductor device includes a control element, an insulating element, and a drive element. In the inverter device, a control signal outputted from an ECU (Engine Control Unit) is inputted to the control element of the semiconductor device. The control element converts the control signal into a PWM (Pulse Width Modulation) control signal and transmits it to the drive element via the insulating element. Based on the PWM control signal, the drive element switches the power semiconductors at appropriate timings. By switching each of six power semiconductors at an appropriate timing, three-phase AC power for motor driving is obtained from the DC power of the vehicle battery. An example of a semiconductor device with an insulating element is disclosed in Patent Document 1.

In the semiconductor device disclosed in Patent Document 1, the control element, the insulating element and the drive element are mounted on die pads. Some of the pads of the control element and the drive element are electrically connected, with bonding wires, to pad portions connected to the die pads. In some semiconductor devices, it may not be possible to provide pad portions to be connected to dies pads or it may be difficult to bond wires to pad portions due to the positional relationship with the pads of the control element and the drive element. In such a case, bonding wires are directly bonded to the die pads.

PRIOR ART DOCUMENT

Patent Document

Patent Document 1: JP-A-2016-207714

SUMMARY OF THE INVENTION

Problem to be Solved by the Invention

The elements are bonded to die pads with a bonding layer. In a heating process for bonding an element to a die pad during the manufacture, the molten material of the bonding layer may spread to a portion of the die pad to which a wire is to be bonded. This makes it difficult to bond a wire to the die pad.

In light of the above circumstances, an object of the present disclosure is to provide a semiconductor device capable of preventing a bonding layer from interfering with wire bonding.

Means to Solve the Problem

A semiconductor device provided according to the present disclosure includes: a first die pad including a first obverse surface facing in a thickness direction; a second die pad spaced apart from the first die pad in a first direction orthogonal to the thickness direction and including a second obverse surface facing in the thickness direction; a first semiconductor element mounted on the first obverse surface; a second semiconductor element mounted on the second obverse surface; an insulating element mounted on the first obverse surface or the second obverse surface and located between the first semiconductor element and the second semiconductor element in the first direction, the insulating element being configured to provide electrical insulation between the first semiconductor element and the second semiconductor element while relaying a signal between the first semiconductor element and the second semiconductor element; a first wire bonded to the first semiconductor element and the first obverse surface; and a sealing resin covering the first semiconductor element, the second semiconductor element and the insulating element. The first die pad includes: a first bond portion located on a first side of the first semiconductor element in a second direction orthogonal to the thickness direction and the first direction, where the first wire is bonded to the first bond portion; and a first opening located between the first bond portion and the first semiconductor element in the second direction and including an opening end in the first obverse surface.

Advantages of the Invention

With the above configuration, it is possible to prevent a bonding layer from interfering with bonding of a wire in a semiconductor device.

Other features and advantages of the present disclosure will become apparent from the detailed description given below with reference to the accompanying drawings.

MODE FOR CARRYING OUT THE INVENTION

Figure 1:
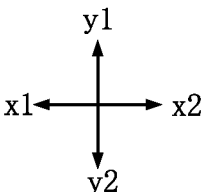
FIG. 1 is a plan view of a semiconductor device according to a first embodiment of the present disclosure.

Preferred embodiments of the present disclosure are described below with reference to the accompanying drawings.

In the present disclosure, the phrases "an object A is formed in an object B" and "an object A is formed on an object B" include, unless otherwise specified, "an object A is formed directly in/on the object B" and "an object A is formed in/on the object B with another object interposed between the object A and the object B". Similarly, the phrases "an object A is disposed in an object B" and "an object A is disposed on an object B" include, unless otherwise specified, "an object A is disposed directly in/on the object B" and "an object A is disposed in/on the object B with another object interposed between the object A and the object B". Similarly, the phrase "an object A is located on an object B" includes, unless otherwise specified, "an object A is located on an object B in contact with the object B" and "an object A is located an object B with another object interposed between the object A and the object B". Also, the phrase "an object A overlaps with an object B as viewed in a certain direction" includes, unless otherwise specified, an object A overlaps with the entirety of an object B" and "an object A overlaps with a portion of an object B".

FIGS. 1 to 12 show an example of a semiconductor device according to a first embodiment. The semiconductor device A10 of the present embodiment includes a first semiconductor element, a second semiconductor element, an insulating element 13, a conductive support member 2, a plurality of wires 61 to 64, and a sealing resin 7. The conductive support member 2 includes a first die pad 3, a second die pad 4, a plurality of input-side terminals 51, a plurality of output-side terminals 52, a plurality of pad portions 53 and 55, a pair of connecting portions 54, and a pair of connecting portions 56. The semiconductor device A10 is configured to be surface-mounted on a wiring board of an inverter device of e.g. a vehicle such as an electric vehicle or a hybrid vehicle. The use and function of the semiconductor device A10 are not limited. The semiconductor device A10 is of a SOP (Small Outline Package) type. The package type of the semiconductor device A10 is not limited to SOP.

Figure 2:
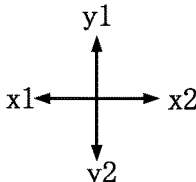
FIG. 2 is a plan view of the semiconductor device of FIG. 1, as seen through a sealing resin.
Figure 3:
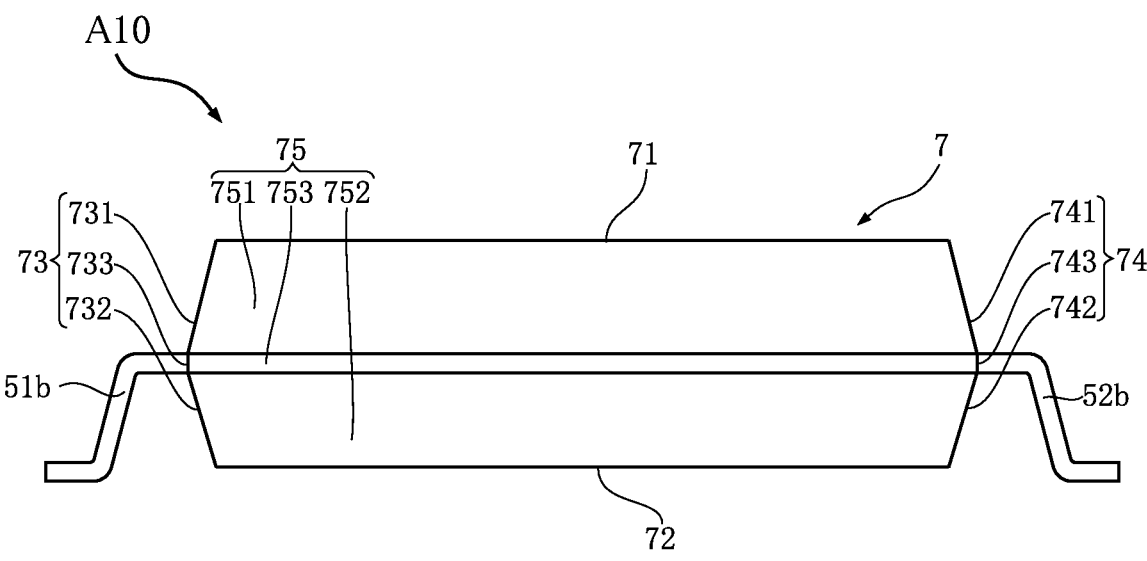
FIG. 3 is a front view of the semiconductor device of FIG. 1.
Figure 3:
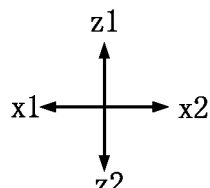
Figure 4:
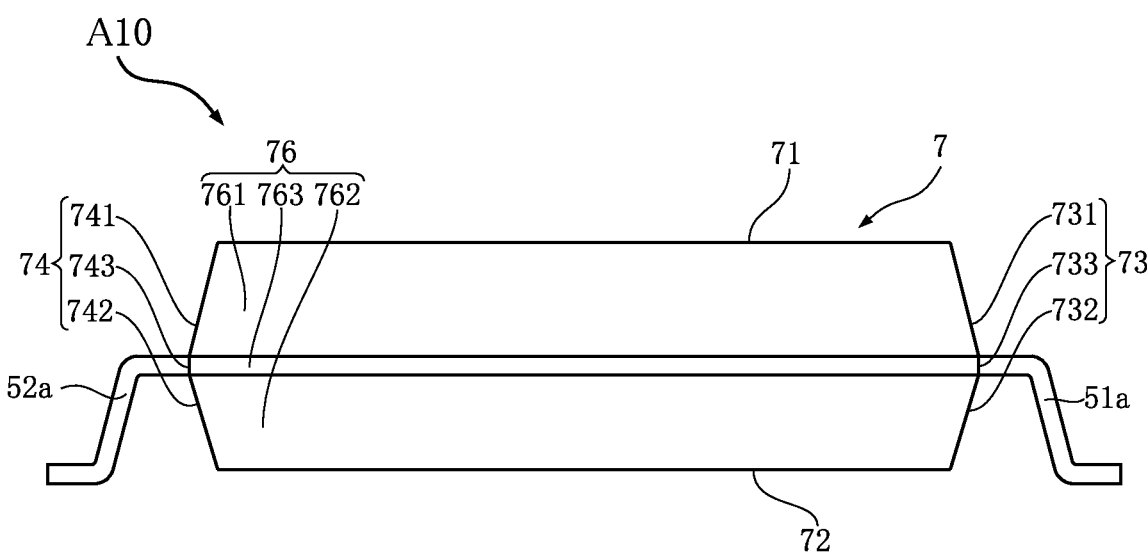
FIG. 4 is a rear view of the semiconductor device of FIG. 1.
Figure 4:
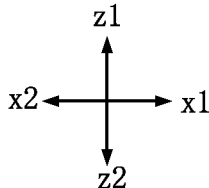
Figure 5:
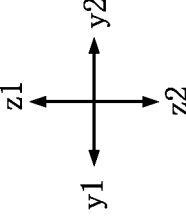
FIG. 5 is a left side view of the semiconductor device of FIG. 1.
Figure 6:
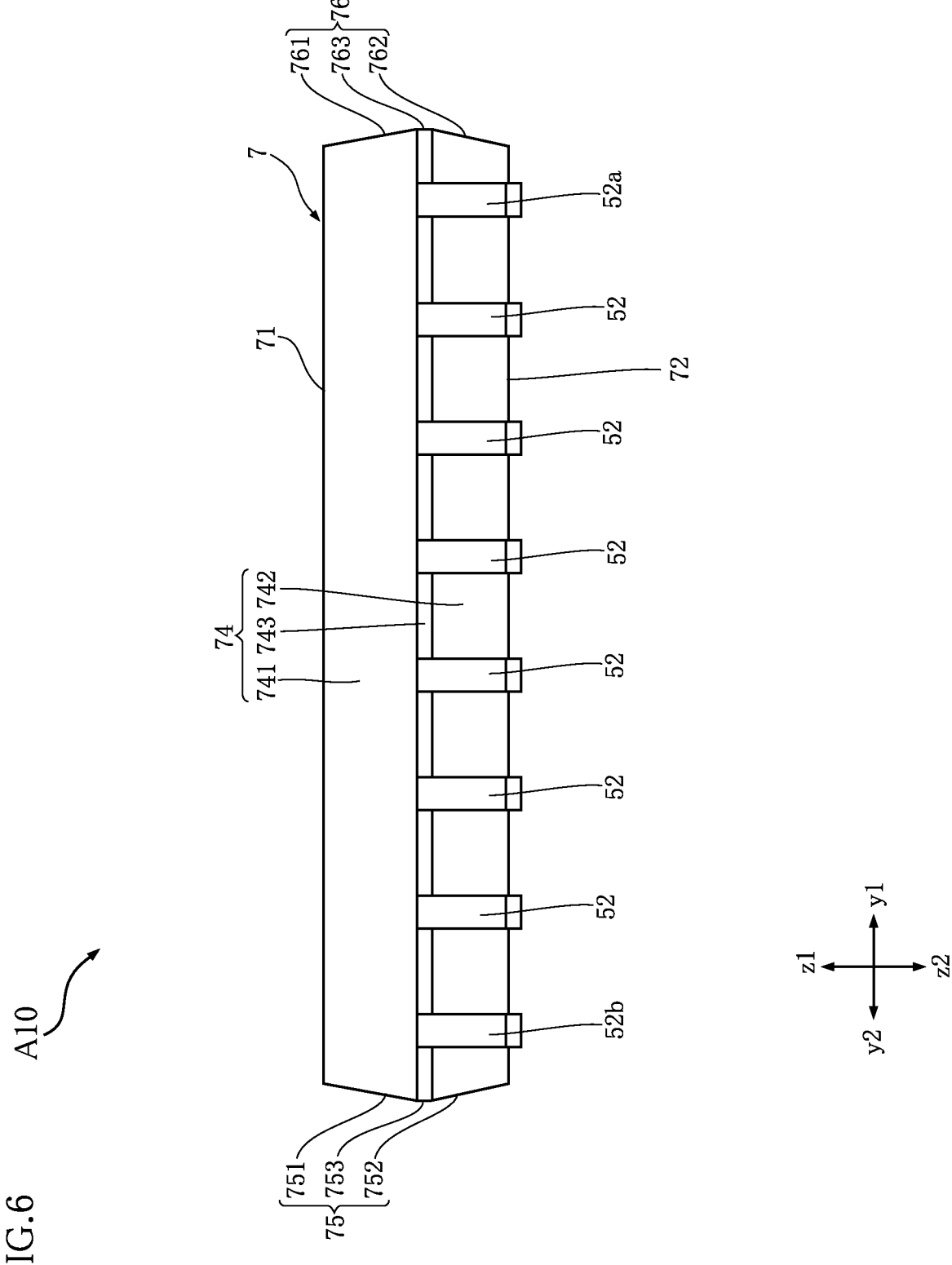
FIG. 6 is a right side view of the semiconductor device of FIG. 1.
Figure 7:
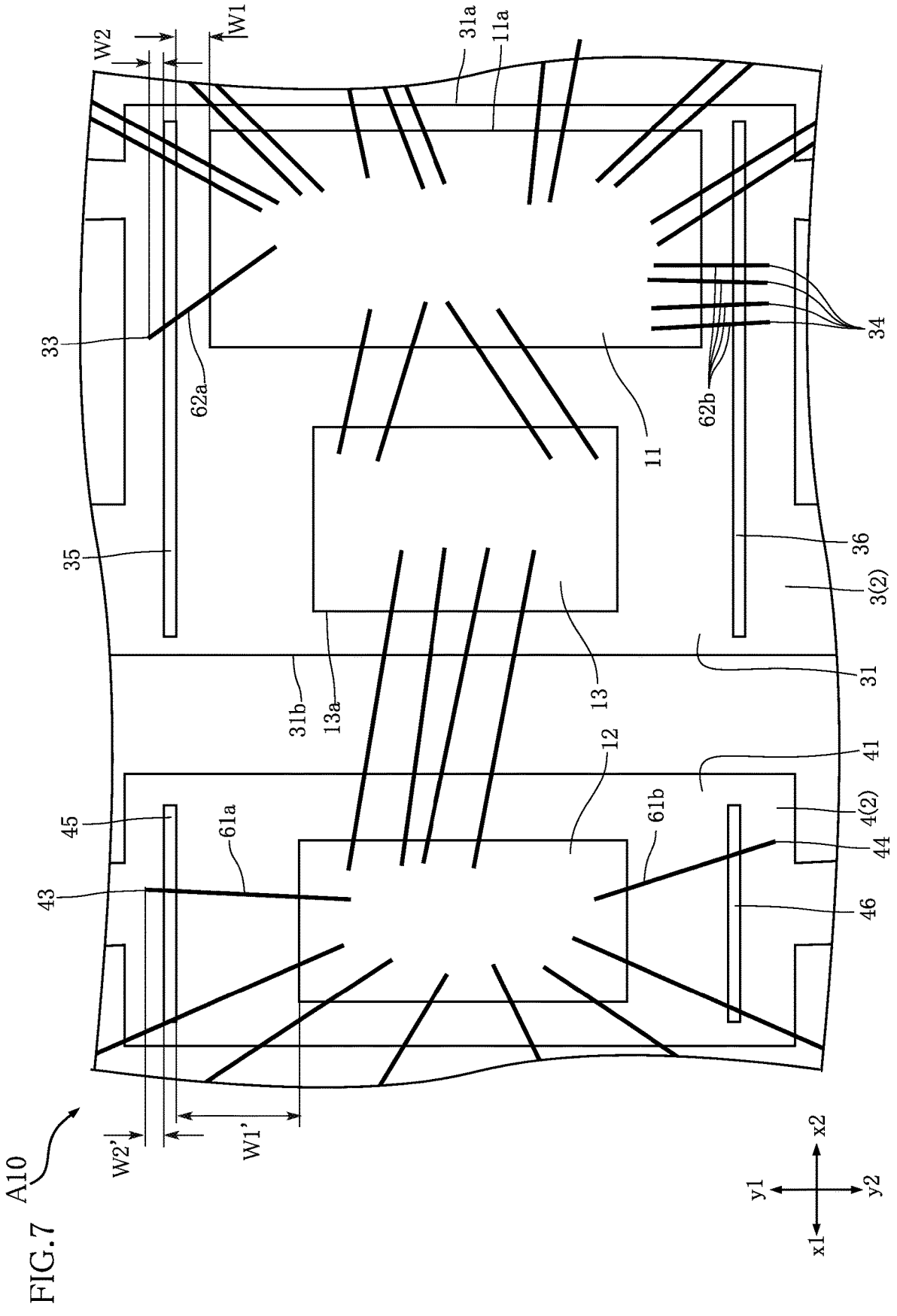
FIG. 7 is an enlarged view of a part of FIG. 2.
Figure 8:
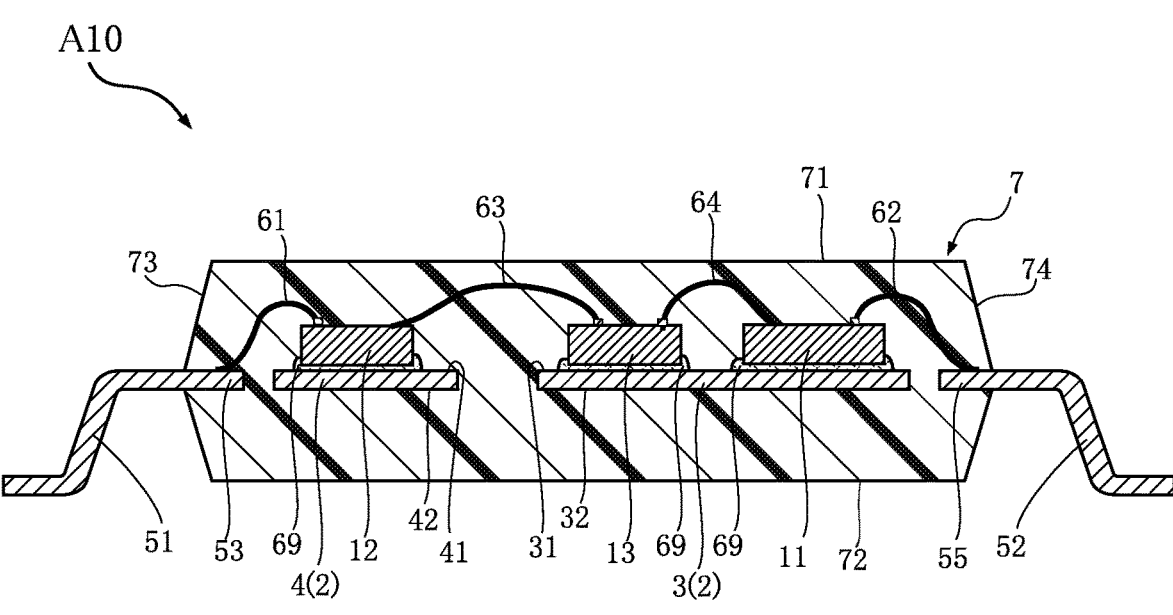
FIG. 8 is a sectional view taken along line VIII-VIII in FIG. 2.
Figure 8:
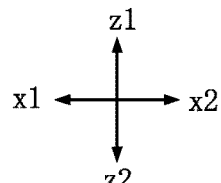
Figure 9:
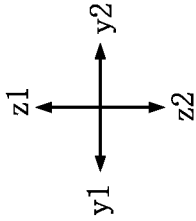
FIG. 9 is a sectional view taken along IX-IX in FIG. 2.
Figure 10:
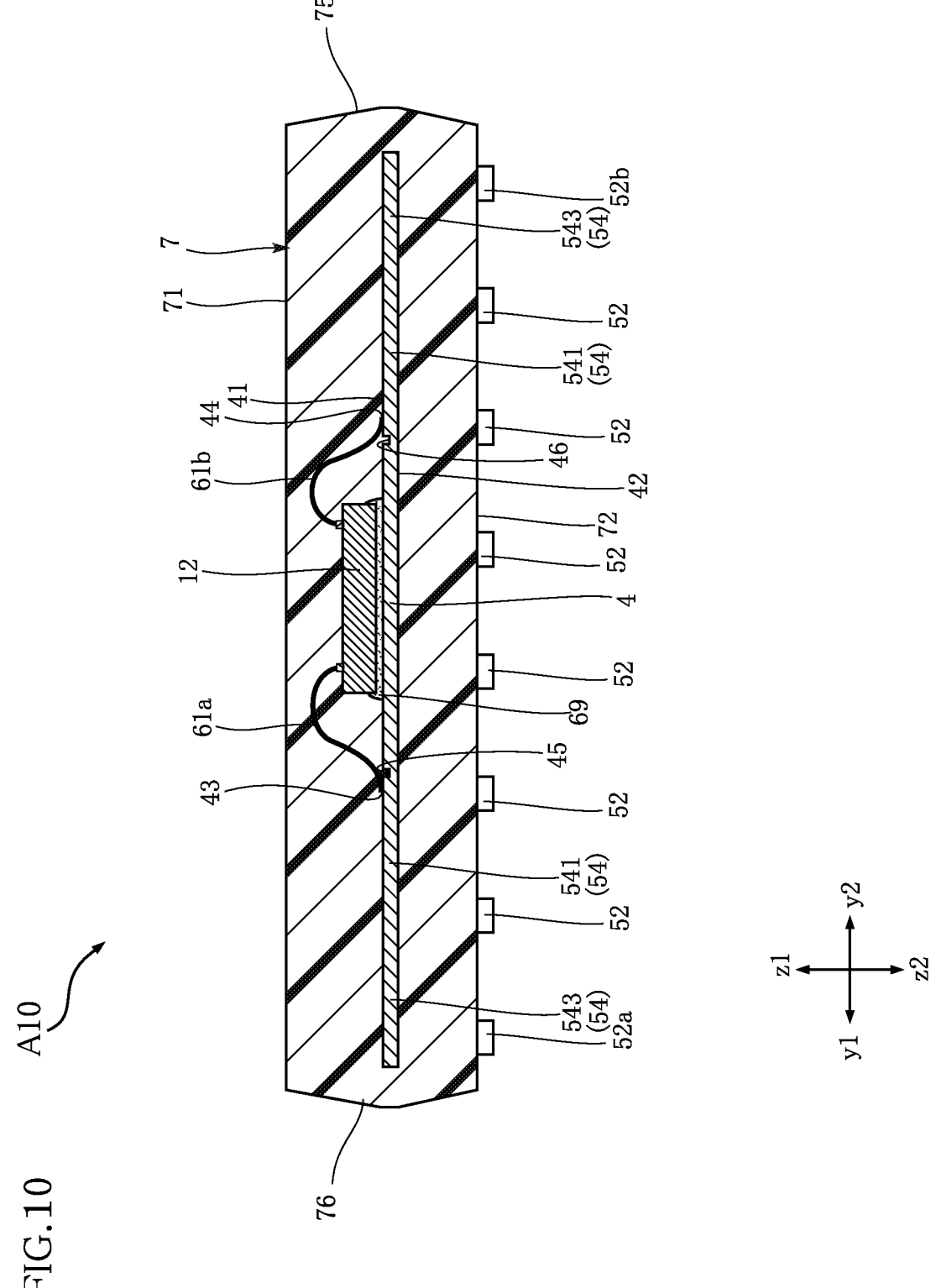
FIG. 10 is a sectional view taken along X-X in FIG. 2.
Figure 11:
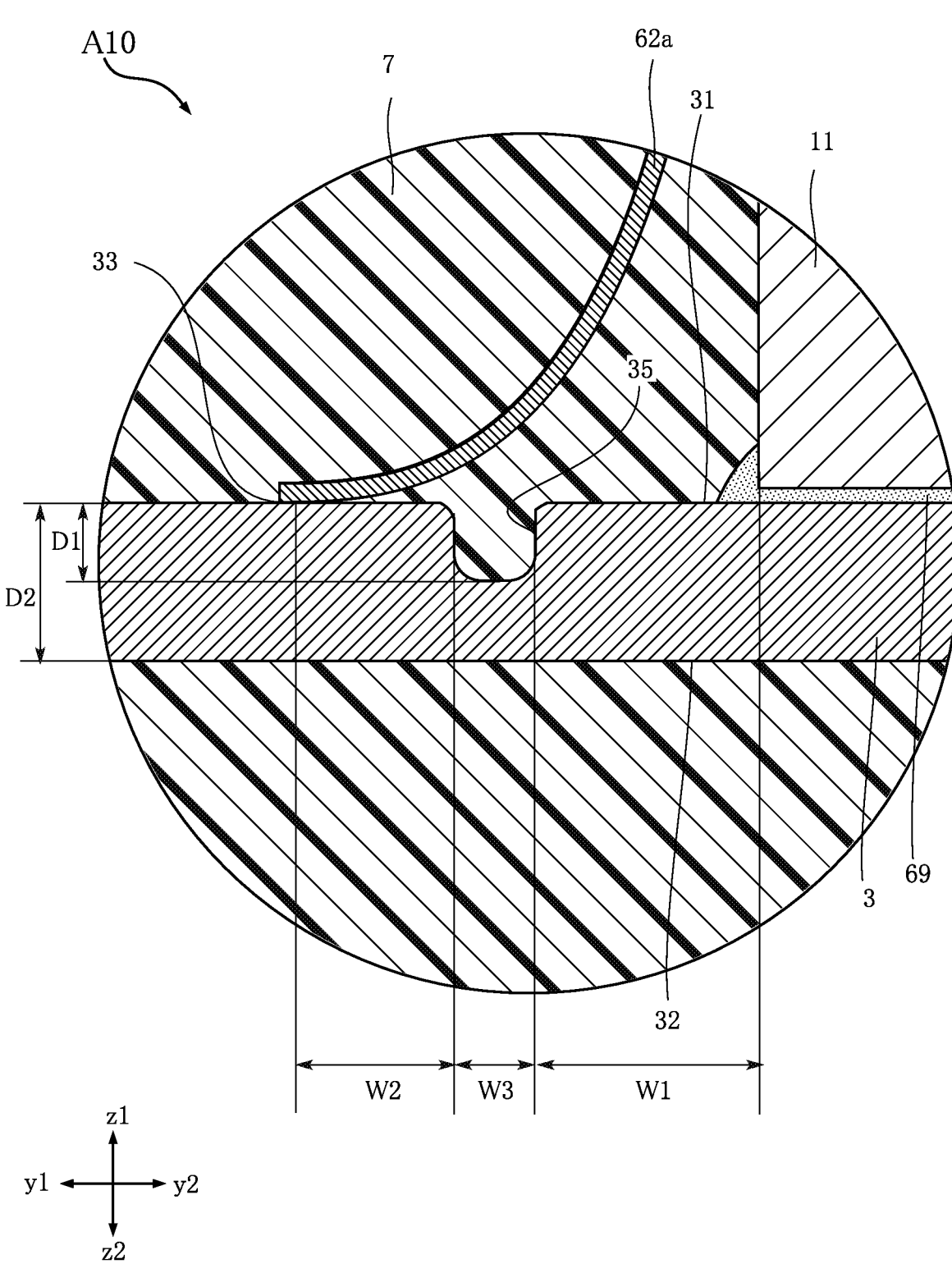
FIG. 11 is an enlarged view of a part of FIG. 9.
Figure 12:
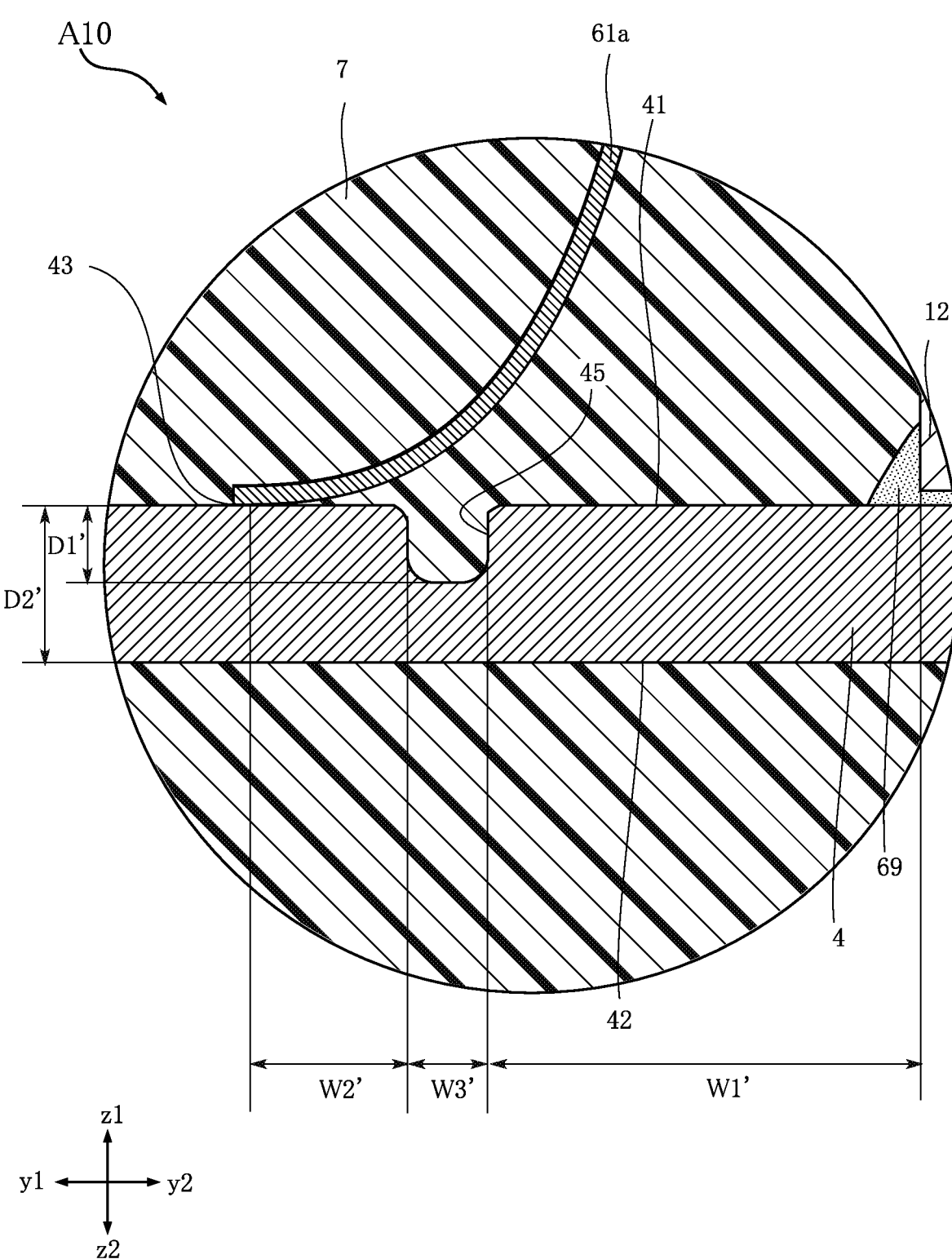
FIG. 12 is an enlarged view of a part of FIG. 10.

FIG. 1 is a plan view of the semiconductor device A10. FIG. 2 is a plan view of the semiconductor device A10. In FIG. 2, for convenience of understanding, the sealing resin 7 is illustrated as transparent, and the outline of the sealing resin 7 is shown by imaginary lines (two-dot chain lines). FIG. 3 is a front view of the semiconductor device A10. FIG. 4 is a rear view of the semiconductor device A10. FIG. 5 is a left side view of the semiconductor device A10. FIG. 6 is a right side view of the semiconductor device A10. FIG. 7 is an enlarged view of a part of FIG. 2. FIG. 8 is a sectional view taken along line VIII-VIII in FIG. 2. FIG. 9 is a sectional view taken along line IX-IX in FIG. 2. FIG. 10 is a sectional view taken along line X-X in FIG. 2. FIG. 11 is an enlarged view of a part of FIG. 9. FIG. 12 is an enlarged view of a part of FIG. 10.

The semiconductor device A10 has an elongated rectangular shape as viewed in the thickness direction (in plan view). For convenience of description, the thickness direction (plan-view direction) of the semiconductor device A10 is referred to as the z direction. A direction along one side of the semiconductor device A10 orthogonal to the z direction (i.e., the horizontal direction in FIGS. 1 and 2) is referred to as the x direction. The direction orthogonal to the z direction and the x direction (i.e., the vertical direction in FIGS. 1 and 2) is referred to as the y direction. The x direction is an example of the "first direction, and the y direction is an example of the "second direction", but the present disclosure is not limited to this. The shape and dimensions of the semiconductor device A10 are not limited.

The first semiconductor element 11, the second semiconductor element 12, and the insulating element 13 are primary elements for the function of the semiconductor device A10.

As shown in FIG. 2, the second semiconductor element 12 is mounted on a portion of the conductive support member 2 (on a second die pad 4 described later). The second semiconductor element 12 is located at the center of the semiconductor device A10 in the y direction and offset toward the x1 side in the x direction. The second semiconductor element 12 has a rectangular shape elongated in the y direction, as viewed in the z direction. The second semiconductor element 12 is a control element. The second semiconductor element 12 has a circuit for converting control signals inputted from e.g. an ECU into PWM control signals, a transmission circuit for transmitting PWM control signals to the first semiconductor element 11, and a receiving circuit for receiving electric signals from the first semiconductor element 11.

As shown in FIG. 2, the first semiconductor element 11 is mounted on a portion of the conductive support member 2 (on a first die pad 3 described later). The first semiconductor element 11 is located at the center of the semiconductor device A10 in the y direction and offset toward the x2 side in the x direction. The first semiconductor element 11 has a rectangular shape elongated in the y direction, as viewed in the z direction. The first semiconductor element 11 is a drive element. The first semiconductor element 11 has a receiving circuit for receiving PWM control signals from the second semiconductor element 12, a circuit (gate driver) for generating and outputting drive signals for a switching element (e.g., an IGBT or a MOSFET) based on the received PWM control signals, and a transmission circuit for transmitting electric signals to the second semiconductor element 12.

As shown in FIG. 2, the insulating element 13 is mounted on a portion of the conductive support member 2 (on the first die pad 3). The insulating element 13 is located at the center of the semiconductor device A10 in the y direction. The insulating element 13 is located on the x1 side of the first semiconductor element 11 and on the x2 side of the second semiconductor element 12 in the x direction. That is, the insulating element 13 is located between the first semiconductor element 11 and the second semiconductor element 12 in the x direction. The insulating element 13 has a rectangular shape elongated in the y direction, as viewed in the z direction. The insulating element 13 transmits PWM control signals and other electric signals in an insulated condition. The insulating element 13 receives PWM control signals from the second semiconductor element 12 via wires 63 and transmits the received PWM control signals to the first semiconductor element 11 via wires 64. Also, the insulating element 13 receives electric signals from the first semiconductor element 11 via wires 64 and transmits the received electric signals to the second semiconductor element 12 via wires 63 in an insulated condition. That is, the insulating element 13 provides electrical insulation between the first semiconductor element 11 and the second semiconductor element 12 while relaying signals between the first semiconductor element 11 and the second semiconductor element 12.

In the present embodiment, the insulating element 13 is an inductor-coupled insulating element. An inductor-coupled insulating element includes two inductively coupled inductors (coils) to realize transmission of electric signals in an insulated state. The insulating element 13 includes a substrate made of Si, on which inductors made of Cu are formed. The inductors include a transmitting-side inductor and a receiving-side inductor, which are stacked in the thickness direction (the z direction) of the insulating element 13. A dielectric layer made of e.g. $SiO_2$ is interposed between the transmitting-side inductor and the receiving-side inductor. The dielectric layer provides electrical insulation between the transmitting-side inductor and the receiving-side inductor. Although the insulating element 13 of an inductive type is illustrated in the present embodiment, the insulating element 13 may be of a capacitive type. One example of a capacitive insulating element is a capacitor.

The second semiconductor element 12 transmits PWM control signals to the first semiconductor element 11 via the insulating element 13. The second semiconductor element 12 may transmit signals other than PWM control signals to the first semiconductor element 11. The first semiconductor element 11 transmits electric signals to the second semiconductor element 12 via the insulating element 13. The information represented by the electric signals transmitted by the first semiconductor element 11 to the second semiconductor element 12 is not limited.

Generally, a motor driver circuit used in an inverter device for e.g., a hybrid vehicle is a half-bridge circuit composed of a low-side switching element and a high-side switching element connected by totem-pole configuration. In an insulated gate driver, only one of the low-side switching element and the high-side switching element is turned ON at any given time. In the high-voltage region, the source of the low-side switching element and the reference voltage of the insulated gate driver for driving the switching element are connected to ground, so that the setting of the gate-to-source voltage is relative to the ground. On the other hand, the source of the high-side switching element and the reference voltage of the insulated gate driver for driving the high-side switching element are connected to the output node of the half-bridge circuit. The potential at the output node of the half-bridge circuit changes depending on which of the low-side switching element and the high-side switching element is ON, so that the reference potential of the high-side insulated gate driver changes as well. When the high-side switching element is ON, the reference potential becomes equal to the voltage applied to the drain of the high-side switching element (for example, 600 V or higher). When the semiconductor device A10 is used as an insulated gate driver for driving the high-side switching element, the first semiconductor element 11 and the second semiconductor element 12 are connected to different grounds for providing insulation, and a voltage of 600 V or higher relative to the ground of the second semiconductor element 12 is transiently applied to the first semiconductor element 11. In light of such a large potential difference occurring between the first semiconductor element 11 and the second semiconductor element 12, the input-side circuit including the second semiconductor element 12 and the output-side circuit including the first semiconductor element 11 are insulated from each other by the insulating element 13 in the semiconductor device A10. That is, the insulating element 13 provides electrical insulation between the input-side circuit held at lower potential and the output-side circuit held at higher potential.

The first semiconductor element 11 has a plurality of electrodes (not shown) on the upper surface (the surface on the z1 side). The second semiconductor element 12 has a plurality of electrodes (not shown) on the upper surface (the surface on the z1 side). The insulating element 13 has a plurality of electrodes (not shown) on the upper surface (the surface on the z1 side).

The conductive support member 2 forms a conduction path between the wiring board of an inverter device and the first and second semiconductor elements 11 and 12. The conductive support member 2 may be made of an alloy containing Cu, for example. The conductive support member 2 is formed from a lead frame 81 described later. The conductive support member 2 have the first semiconductor element 11, the second semiconductor element 12, and the insulating element 13 mounted thereon. As shown in FIG. 2, the conductive support member 2 includes the first die pad 3, the second die pad 4, the input-side terminals 51, the output-side terminals 52, the pad portions 53 and 55, the pair of connecting portions 54, and the pair of connecting portions 56.

The first die pad 3 is located at the center of the semiconductor device A10 in the y direction and offset toward the x2 side in the x direction. The second die pad 4 is located on the x1 side of the first die pad 3 in the x direction and spaced apart from the first die pad 3.

As shown in FIGS. 2 and 7 to 9, the first semiconductor element 11 and the insulating element 13 are mounted on the first die pad 3. The first die pad 3 is electrically connected to the first semiconductor element 11 and is a component of the above-mentioned output-side circuit. The first die pad 3 may be rectangular (or generally rectangular) as viewed in the z direction. The first die pad 3 has a first obverse surface 31 and a first reverse surface 32. As shown in FIGS. 8 and 9, the first obverse surface 31 and the first reverse surface 32 are spaced apart from each other in the z direction. The first obverse surface 31 faces the z1 side and the first reverse surface 32 faces the z2 side. The first obverse surface 31 and the first reverse surface 32 are flat (or generally flat). As shown in FIGS. 8 and 9, the first semiconductor element 11 is bonded to the first obverse surface 31 of the first die pad 3 with a bonding layer 69. The bonding layer 69 may be a layer formed by solidifying a metal paste such as Ag paste. The bonding layer 69 is not limited and may be solder, sintered metal, or insulating paste, for example.

In the present embodiment, the first die pad 3 includes a first bond portion 33, a plurality of second bond portions 34, a first opening 35, and a second opening 36. As shown in FIGS. 7, 9 and 11, the first bond portion 33 is the portion to which a wire 62a, described later, is bonded and is located on the y1 side of the first semiconductor element 11 in the y direction. As shown in FIGS. 7 and 9, each of the second bond portions 34 is the portions to which one of the wires 62b, described later, is bonded, and is located on the y2 side of the first semiconductor element 11 in the y direction. Of the first obverse surface 31 of the first die pad 3, the first bond portion 33 and the nearby portion, and the second bond portions 34 and the nearby portion may be plated. The plating layer formed by such plating may contain a metal such as Ag. The plating layer increases the bonding strength of the wires 62a and 62b and protects the lead frame 81 (described later) from the shock during the wire bonding.

As shown in FIGS. 2, 7, 9 and 11, the first opening 35 has an opening end in the first obverse surface 31, and is a groove recessed from the first obverse surface 31 in the z direction in the present embodiment. As shown in FIG. 7, the first opening 35 extends in the x direction. As viewed in the z direction, opposite ends of the first opening 35 in the x direction are located inward from the outer edge of the first obverse surface 31. That is, the first opening 35 does not extend to the outer edge of the first obverse surface 31. In the present embodiment, the distance between each end of the first opening 35 in the x direction and the outer edge of the first obverse surface 31 is not less than 50 μm and not more than 200 μm and may be about 150 μm, for example. In the x direction, the end of the first opening 35 on the x2 side is located between the end surface 11a of the first semiconductor element 11 on the x2 side and the outer edge 31a of the first obverse surface 31 on the x2 side. In the x direction, the end of the first opening 35 on the x1 side is located between the end surface 13a of the insulating element 13 on the x1 side and the outer edge 31b of the first obverse surface 31 on the x1 side. That is, as viewed in the y direction, the first opening 35 overlaps with the entirety of the first semiconductor element 11 and the entirety of the insulating element 13. As shown in FIGS. 7 and 11, the first opening 35 is located between the first bond portion 33 and the first semiconductor element 11 in the y direction. In the present embodiment, the first opening 35 is located closer to the first bond portion 33 than to the first semiconductor element 11. That is, in the y direction, the first distance W1 between the first opening 35 and the first semiconductor element 11 is greater than the second distance W2 between the first opening 35 and the first bond portion 33. As shown in FIG. 11, the depth D1 (the dimension in the z direction) of the first opening 35 is about half the thickness D2 (the dimension in the z direction) of the first die pad 3. The width W3 (the dimension in the y direction) of the first opening 35 is approximately equal to the depth D1. In the present embodiment, the thickness D2 of the first die pad 3 is about 220 μm, and the depth D1 and the width W3 of the first opening 35 is about 110 μm. With an excessively small width W3 of the first opening 35, the advantages described later may be less easy to achieve. With an excessively large width W3, the area for bonding the wire 62a is reduced. Thus, it is desirable that the width W3 of the first opening 35 is not less than 100 μm and not more than 250 μm. The shape, arrangement and dimensions of the first opening 35 are not limited to those described above.

As shown in FIGS. 2, 7, 9 and 11, the second opening 36 has an opening end in the first obverse surface 31, and is a groove recessed from the first obverse surface 31 in the z direction in the present embodiment. As shown in FIG. 7, the second opening 36 extends in the x direction. As viewed in the z direction, opposite ends of the second opening 36 in the x direction are located inward from outer edge of the first obverse surface 31. That is, the second opening 36 does not extend to the outer edge of the first obverse surface 31. In the present embodiment, the distance between each end of the second opening 36 in the x direction and the outer edge of the first obverse surface 31 is not less than 50 μm and not more than 200 μm and may be about 150 μm, for example. In the x direction, the end of the second opening 36 on the x2 side is located between the end surface 11a of the first semiconductor element 11 on the x2 side and the outer edge 31a of the first obverse surface 31 on the x2 side. In the x direction, the end of the second opening 36 on the x1 side is located between the end surface 13a of the insulating element 13 on the x1 side and the outer edge 31b of the first obverse surface 31 on the x1 side. That is, as viewed in the y direction, the second opening 36 overlaps with the entirety of the first semiconductor element 11 and the entirety of the insulating element 13. As shown in FIGS. 7 and 9, the second opening 36 is located between the second bond portions 34 and the first semiconductor element 11 in the y direction. In the present embodiment, the second opening 36 is located closer to the second bond portions 34 than to the first semiconductor element 11. That is, in the y direction, the distance between the second opening 36 and the first semiconductor element 11 is greater than the distance between the second opening 36 and each second bond portion 34. The depth (the dimension in the z direction) of the second opening 36 is approximately equal to the depth D1 of the first opening 35 and about half the thickness D2 of the first die pad 3. The width (the dimension in the y direction) of the second opening 36 is approximately equal to the width W3 of the first opening 35. The shape, arrangement and dimensions of the second opening 36 are not limited to those described above.

As shown in FIGS. 2, 7, 8 and 10, the second semiconductor element 12 is mounted on the second die pad 4. The second die pad 4 is electrically connected to the second semiconductor element 12 and is a component of the above-mentioned input-side circuit. The second die pad 4 may be rectangular (or generally rectangular) as viewed in the z direction. The second die pad 4 has a second obverse surface 41 and a second reverse surface 42. As shown in FIGS. 8 and 10, the second obverse surface 41 and the second reverse surface 42 are spaced apart from each other in the z direction. The second obverse surface 41 faces the z1 side and the second reverse surface 42 faces the z2 side. The second obverse surface 41 and the second reverse surface 42 are flat (or generally flat). As shown in FIGS. 8 and 10, the second semiconductor element 12 is bonded to the second obverse surface 41 of the second die pad 4 with a bonding layer 69.

In the present embodiment, the second die pad 4 includes a third bond portion 43, a fourth bond portion 44, a third opening 45, and a fourth opening 46. As shown in FIGS. 10 and 12, the third bond portion 43 is the portion to which a wire 61a, described later, is bonded and is located on the y1 side of the second semiconductor element 12 in the y direction. As shown in FIG. 10, the fourth bond portion 44 is the portion to which a wire 61b, described later, is bonded and is located on the y2 side of the second semiconductor element 12 in the y direction. Of the second obverse surface 41 of the second die pad 4, the third bond portion 43 and the nearby portion, and the fourth bond portions 44 and the nearby portion may be formed with a plating layer (e.g., a metal layer containing Ag) as with the first obverse surface 31.

As shown in FIGS. 2, 7, 10 and 12, the third opening 45 has an opening end in the second obverse surface 41, and is a groove recessed from the second obverse surface 41 in the z direction in the present embodiment. As shown in FIG. 7, the third opening 45 extends in the x direction. As viewed in the z direction, opposite ends of the third opening 45 in the x direction are located inward from outer edge of the second obverse surface 41. That is, the third opening 45 does not extend to the outer edge of the second obverse surface 41.

In the present embodiment, the distance between each end of the third opening 45 in the x direction and the outer edge of the second obverse surface 41 is not less than 50 μm and not more than 200 μm and may be about 150 μm, for example. In the x direction, the end of the third opening 45 on the x2 side is located between the end surface of the second semiconductor element 12 on the x2 side and the outer edge of the second obverse surface 41 on the x2 side. In the x direction, the end of the third opening 45 on the x1 side is located between the end surface of the second semiconductor element 12 on the x1 side and the outer edge of the second obverse surface 41 on the x1 side. That is, as viewed in the y direction, the third opening 45 overlaps with the entirety of the second semiconductor element 12. As shown in FIGS. 7 and 12, the third opening 45 is located between the third bond portion 43 and the second semiconductor element 12 in the y direction. In the present embodiment, the third opening 45 is located closer to the third bond portion 43 than to the second semiconductor element 12. That is, in the y direction, the first distance W1' between the third opening 45 and the second semiconductor element 12 is greater than the second distance W2' between the third opening 45 and the third bond portion 43. As shown in FIG. 12, the depth D1' (the dimension in the z direction) of the third opening 45 is about half the thickness D2' (the dimension in the z direction) of the second die pad 4. The width W3' (the dimension in the y direction) of the third opening 45 is approximately equal to the depth D1'. In the present embodiment, the thickness D2' of the second die pad 4 is about 220 μm, and the depth D1' and the width W3' of the third opening 45 is about 110 μm. With an excessively small width W3' of the third opening 45, the advantages described later may be difficult to achieve. With an excessively large width W3' the area for bonding the wire 61a is reduced. Thus, it is desirable that the width W3' of the third opening 45 is not less than 100 μm and not more than 250 μm. The shape, arrangement and dimensions of the third opening 45 are not limited to those described above.

As shown in FIGS. 2, 7, and 10, the fourth opening 46 has an opening end in the second obverse surface 41, and is a groove recessed from the second obverse surface 41 in the z direction in the present embodiment. As shown in FIG. 7, the fourth opening 46 extends in the x direction. As viewed in the z direction, opposite ends of the fourth opening 46 in the x direction are located inward from outer edge of the second obverse surface 41. That is, the fourth opening 46 does not extend to the outer edge of the second obverse surface 41. In the present embodiment, the distance between each end of the fourth opening 46 in the x direction and the outer edge of the second obverse surface 41 is not less than 50 μm and not more than 200 μm and may be about 150 μm, for example. In the x direction, the end of the fourth opening 46 on the x2 side is located between the end surface of the second semiconductor element 12 on the x2 side and the outer edge of the second obverse surface 41 on the x2 side. In the x direction, the end of the fourth opening 46 on the x1 side is located between the end surface of the second semiconductor element 12 on the x1 side and the outer edge of the second obverse surface 41 on the x1 side. That is, as viewed in the y direction, the fourth opening 46 overlaps with the entirety of the second semiconductor element 12. As shown in FIGS. 7 and 10, the fourth opening 46 is located between the fourth bond portion 44 and the second semiconductor element 12 in the y direction. In the present embodiment, the fourth opening 46 is located closer to the fourth bond portion 44 than to the second semiconductor element 12. That is, in the y direction, the distance between the fourth opening 46 and the second semiconductor element 12 is greater than the distance between the fourth opening 46 and the fourth bond portion 44. The depth (the dimension in the z direction) of the fourth opening 46 is approximately equal to the depth D1' of the third opening 45 and about half the thickness D2' of the second die pad 4. The width (the dimension in the y direction) of the fourth opening 46 is approximately equal to the width W3' of the third opening 45. The shape, arrangement and dimensions of the fourth opening 46 are not limited to those described above.

The input-side terminals 51 are bonded to the wiring board of an inverter device to form a conduction path between the wiring board and the semiconductor device A10. Each input-side terminal 51 is electrically connected to the second semiconductor element 12 and serves as a component of the above-mentioned input-side circuit. As shown in FIGS. 1, 2 and 5, the input-side terminals 51 are arranged at equal intervals along the y-direction. All of the input-side terminals 51 are located on the x1 side of the second die pad 5 in the x direction and protrude from the sealing resin 7 (from the first side surface 73 descried later) toward the x1 side in the x direction. The input-side terminals 51 include, for example, a power terminal for receiving voltage supply, a ground terminal, an input terminal for receiving control signals, an input terminal for receiving other electric signals, and an output terminal for outputting electric signals as required. In the present embodiment, the semiconductor device A10 has eight input-side terminals 51. The number of input-side terminals 51 is not limited. The signals inputted or outputted through the input-side terminals 51 are not limited.

Each input-side terminal 51 has a rectangular shape elongated in the x direction and includes a portion exposed from the sealing resin 7 and a portion covered with the sealing resin 7. As shown in FIG. 8, the portion of each input-side terminal 51 that is exposed from the sealing resin 7 is bent in a gull-wing profile. The portion of each input-side terminal 51 that is exposed from the sealing resin 7 may be plated. The plating layer formed by such plating may be a layer of an alloy containing Sn such as solder and covers the portion exposed from the sealing resin 7. When the semiconductor device A10 is surface-mounted to the wiring board of an inverter device by soldering, the plating layer facilitates adhesion of solder to the exposed portion and also prevents corrosion of the exposed portion caused by soldering. The input-side terminals 51 include an input-side terminal 51a and an input-side terminal 51b. Of the plurality of input-side terminals 51, the input-side terminal 51a is the outermost one on the y1 side in the y direction, and the input-side terminal 51b is the outermost one on the y2 side in the y direction.

The pad portions 53 are connected to the x2 side in the x direction of the input-side terminals 51 other than the input-side terminals 51a and 51b. The shape of each pad portion 53 as viewed in the z direction is not limited but is a rectangular shape elongated in the y direction in the present embodiment. The upper surface (the surface on the z1 side) of each pad portion 53 is flat (or generally flat), and a wire 61, described later, is bonded to the upper surface. The upper surface of each pad portion 53 may be plated. The plating layer formed by such plating may be a metal layer such as a Ag layer and covers the upper surface of the pad portion 53. The metal layer increases the bonding strength of the wire 61 and also protects the lead frame 81 (described later) from the shock during the wire bonding. Each pad portion 53 is entirely covered with the sealing resin 7.

Each of the paired connecting portions 54 is connected to the input-side terminal 51*a* or the input-side terminal 51*b* and the second die pad 4. Each connecting portion 54 includes a coupling section 541 and a joint section 543. The coupling section 541 is connected to the end of the second die pad 4 in the y direction and extends from the second die pad 4 in the y direction. The joint section 543 is connected to the coupling section 541 and to the x2 side in the x direction of the input-side terminal 51*a* or the input-side terminal 51*b*. The joint section 543 is rectangular (or generally rectangular) as viewed in the z direction and has a through-hole 543*a* penetrating in the z direction at the center. In this way, the input-side terminal 51*a* and the input-side terminal 51*b* are connected to the second die pad 4 via the paired connecting portions 54 and support the second die pad 4.

As with the input-side terminals 51, the output-side terminals 52 are configured to be bonded to the wiring board of an inverter device to form a conduction path with the wiring board. Each output-side terminal 52 is electrically connected to the first semiconductor element 11 and serves as a component of the above-mentioned output-side circuit. As shown in FIGS. 1, 2 and 6, the output-side terminal 52 are arranged at equal intervals along the y-direction. All of the output-side terminals 52 are located on the x2 side of the second die pad 4 in the x direction and protrude from the sealing resin 7 (from the second side surface 74 descried later) toward the x2 side in the x direction. The output-side terminals 52 include, for example, a power terminal for receiving voltage supply, a ground terminal, an output terminal for outputting drive signals, an input terminal for receiving other electric signals, and an output terminal for outputting other electric signals. In the present embodiment, the semiconductor device A10 has eight output-side terminals 52. The number of output-side terminals 52 is not limited. The signals inputted or outputted through the output-side terminals 52 are not limited.

Each output-side terminal 52 has a rectangular shape elongated in the x direction and includes a portion exposed from the sealing resin 7 and a portion covered with the sealing resin 7. As shown in FIG. 8, the portion of each output-side terminal 52 that is exposed from the sealing resin 7 is bent in a gull-wing profile. The portion of each output-side terminal 52 that is exposed from the sealing resin 7 may be formed with a plating layer (e.g., a layer of an alloy containing Sn such as solder). The output-side terminals 52 include an output-side terminal 52*a* and an output-side terminal 52*b*. Of the plurality of output-side terminal 52, the output-side terminal 52*a* is the outermost one on the y1 side in the y direction, and the output-side terminal 52*b* is the outermost one on the y2 side in the y direction. The output-side terminals 52 are an example of "a plurality of terminals". The output-side terminal 52*a* and the output-side terminal 52*b* are an example of "a pair of outer terminals".

The pad portions 55 are connected to the x1 side in the x direction of the output-side terminals 52 other than the output-side terminals 52*a* and 52*b*. The shape of each pad portion 55 as viewed in the z direction is not limited but is a rectangular shape elongated in the y direction in the present embodiment. The upper surface (the surface facing the z1 side) of each pad portion 55 is flat (or generally flat), and a wire 62, described later, is bonded to the upper surface. As with the upper surfaces of the pad portions 53, the upper surface of each pad portion 55 may covered with a plating layer (e.g., a metal layer such as a Ag layer). Each pad portion 55 is entirely covered with the sealing resin 7.

Each of the paired connecting portions 56 is connected to the output-side terminal 52*a* or the output-side terminal 52*b* and the first die pad 3. Each connecting portion 56 includes a first coupling section 561, a second coupling section 562, and a joint section 563. The first coupling section 561 is connected to the end of the first die pad 3 in the y direction at a position offset toward the x2 side in the x direction and extends from the first die pad 3 to the joint section 563 in the y direction. The second coupling section 562 is connected to the end of the first die pad 3 in the y direction at a position offset toward the x1 side in the x direction. The second coupling section 562 includes a first part 562*a* and a second part 562*b*. The first part 562*a* extends from the first die pad 3 in the y direction. The second part 562*b* is connected to the first part 562*a* and the joint section 563 and extends in a direction inclined with respect to the y direction. The joint section 563 is connected to the first and second coupling sections 561 and 562 and to the x1 side in the x direction of the output-side terminal 52*a* or the output-side terminal 52*b*. The joint section 563 is rectangular (or generally rectangular) as viewed in the z direction and has a through-hole 563*a* penetrating in the z direction at the center. In this way, the output-side terminal 52*a* and the output-side terminal 52*b* are connected to the first die pad 3 via the paired connecting portions 56 and support the first die pad 3.

As shown in FIG. 2, the wires 61-64 form, together with the conductive support member 2, conduction paths for the first semiconductor element 11 and the second semiconductor element 12 to perform predetermined functions. The material of the wires 61-64 is a metal containing Au, Cu or Al, for example.

As shown in FIGS. 2, 8 and 10, the wires 61 form conduction paths between the second semiconductor element 12 and the input-side terminals 51. Each wire 61 electrically connects the second semiconductor element 12 to at least one of the input-side terminals 51. The wires 61 are the components of the input-side circuit described above. As shown in FIG. 2, each wire 61 is bonded to one of the electrodes of the second semiconductor element 12. The wires 61 include a wire 61*a* and a wire 61*b*. As shown in FIGS. 10 and 12, the wire 61*a* extends from the second semiconductor element 12 toward the y1 side in the y direction and is bonded to a portion of the second obverse surface 41 of the second die pad 4 that is located on the y1 side in the y direction of the third opening 45. The portion of the second obverse surface 41 to which the wire 61*a* is bonded is the third bond portion 43. The wire 61*a* is an example of the "third wire". As shown in FIG. 10, the wire 61*b* extends from the second semiconductor element 12 toward the y2 side in the y direction and is bonded to a portion of the second obverse surface 41 of the second die pad 4 that is located on the y2 side in the y direction of the fourth opening 46. The portion of the second obverse surface 41 to which the wire 61*b* is bonded is the fourth bond portion 44. The wire 61*b* is an example of the "fourth wire". The respective numbers of wires 61*a* and wires 61*b* are not limited. As shown in FIGS. 2 and 8, each of the wires other than the wires 61*a* and 61*b* extends from the second semiconductor element 12 toward the x1 side in the x direction and is bonded to one of the pad portions 53. The number of wires 61 bonded to each pad portion 53 is not limited.

As shown in FIGS. 2, 8 and 9, the wires 62 form conduction paths between the first semiconductor element 11 and the output-side terminal terminals 52. Each wire 62 electrically connects the first semiconductor element 11 to at least one of the output-side terminals 52. The wires 62 are the components of the output-side circuit described above.

As shown in FIG. 2, each wire 62 is bonded to one of the electrodes of the first semiconductor element 11. The wires 62 include a wire 62*a* and wires 62*b*. As shown in FIGS. 9 and 11, the wire 62*a* extends from the second semiconductor element 12 toward the y1 side in the y direction and is bonded to a portion the first obverse surface 31 of the first die pad 3 that is located on the y1 side in the y direction of the first opening 35. The portion of the first obverse surface 31 to which the wire 62*a* is bonded is the first bond portion 33. The wire 62*a* is an example of the "first wire". As shown in FIGS. 7 and 9, the wires 62*b* extend from the first semiconductor element 11 toward the y2 side in the y direction and are bonded to portions of the first obverse surface 31 of the first die pad 3 that are on the y2 side in the y direction of the second opening 36. Each of the portions of the first obverse surface 31 to which a wire 62*b* is bonded is a second bond portion 34. Each of the wires 62*b* is an example of the "second wire". The respective numbers of wires 62*a* and wires 62*b* are not limited. As shown in FIGS. 2 and 8, each of the wires other than the wires 62*a* and 62*b* extends from the first semiconductor element 11 toward the x2 side in the x direction and is bonded to one of the pad portions 55. The number of wires 62 bonded to each pad portion 55 is not limited.

As shown in FIGS. 2 and 8, the wires 63 form conduction paths between the second semiconductor element 12 and the insulating element 13. The second semiconductor element 12 and the insulating element 13 are electrically connected to each other with the wires 63. The wires 63 are the components of the input-side circuit described above. As shown in FIG. 2, each wire 63 is bonded to one of the electrodes of the second semiconductor element 12 and one of the electrodes of the insulating element 13.

As shown in FIGS. 2 and 8, the wires 64 form conduction paths between the first semiconductor element 11 and the insulating element 13. The first semiconductor element 11 and the insulating element 13 are electrically connected to each other with the wires 64. The wires 64 are the components of the output-side circuit described above. As shown in FIG. 2, each wire 64 is bonded to one of the electrodes of the first semiconductor element 11 and one of the electrodes of the insulating element 13.

As shown in FIG. 1, the sealing resin 7 covers the first semiconductor element 11, the second semiconductor element 12, the insulating element 13, the first die pad 3, the second die pad 4, the pair of connecting portions 54, the pair of connecting portions 56, the pad portions 53 and 55, the wires 61 to 64, a part of each input-side terminal 51, and a part of each output-side terminal 52. The sealing resin 7 is electrically insulating. The sealing resin 7 is made of a material containing black epoxy resin, for example. As viewed in the z direction, the sealing resin 7 has a rectangular shape elongated in the y direction. In the present embodiment, the sealing resin 7 is about 700 to 800 μm in dimension in the x direction, about 1000 to 1100 μm in dimension in the y direction, and about 200 to 300 μm in dimension in the z direction. Each dimension is not limited.

As shown in FIGS. 3 to 6, the sealing resin 7 has a top surface 71, a bottom surface 72, a first side surface 73, a second side surface 74, a third side surface 75, and a fourth side surface 76.

The top surface 71 and the bottom surface 72 are spaced apart from each other in the z direction. The top surface 71 and the bottom surface 72 face away from each other in the z direction. The top surface 71 is located on the z1 side in the z direction and faces the z1 side, as with the first obverse surface 31 of the first die pad 3. The bottom surface 72 is located on the z2 side in the z direction and faces the z2 side, as with the first reverse surface 32 of the first die pad 3. Each of the top surface 71 and the bottom surface 72 is flat (or generally flat).

Each of the first side surface 73, the second side surface 74, the third side surface 75 and the fourth side surface 76 is connected to the top surface 71 and the bottom surface 72 and located between the top surface 71 and the bottom surface 72 in the z direction. The first side surface 73 and the second side surface 74 are spaced apart from each other in the x direction. The first side surface 73 and the second side surface 74 face away from each other in the x direction. The first side surface 73 is located on the x1 side in the x direction, and the second side surface 74 is located on the x2 side in the x direction. The third side surface 75 and the fourth side surface 76 are spaced apart from each other in the y direction and connected to the first side surface 73 and the second side surface 74. The third side surface 75 and the fourth side surface 76 face away from each other in the y direction. The third side surface 75 is located on the y2 side in the y direction, and the fourth side surface 76 is located on the y1 side in the y direction.

As shown in FIG. 1, from the first side surface 73*a* protrudes a portion of each input-side terminal 51. Also, from the second side surface 74 protrudes a portion of each output-side terminal 52. No portion of the conductive support member 2 is exposed at the third side surface 75 and the fourth side surface 76.

As shown in FIGS. 3 to 5, the first side surface 73 includes a first region 731, a second region 732, and a third region 733. The first region 731 has one end in the z direction connected to the top surface 71 and the other end in the z direction connected to the third region 733. The first region 731 is inclined with respect to the top surface 71. The second region 732 has one end in the z direction connected to the bottom surface 72 and the other end in the z direction connected to the third region 733. The second region 732 is inclined with respect to the bottom surface 72. The third region 733 has one end in the z direction connected to the first region 731 and the other end in the z direction connected to the second region 732. The third region 733 extends parallel to the z direction and the y direction. As viewed in the z direction, the third region 733 is located outside the top surface 71 and the bottom surface 72. A portion of each input-side terminal 51 is exposed at the third region 733.

As shown in FIGS. 3, 4 and 6, the second side surface 74 includes a fourth region 741, a fifth region 742, and a sixth region 743. The fourth region 741 has one end in the z direction connected to the top surface 71 and the other end in the z direction connected to the sixth region 743. The fourth region 741 is inclined with respect to the top surface 71. The fifth region 742 has one end in the z direction connected to the bottom surface 72 and the other end in the z direction connected to the sixth region 743. The fifth region 742 is inclined with respect to the bottom surface 72. The sixth region 743 has one end in the z direction connected to the fourth region 741 and the other end in the z direction connected to the fifth region 742. The sixth region 743 extends parallel to the z direction and the y direction. As viewed in the z direction, the sixth region 743 is located outside the top surface 71 and the bottom surface 72. A portion of each output-side terminal 52 is exposed at the sixth region 743.

As shown in FIGS. 3, 5 and 6, the third side surface 75 includes a seventh region 751, an eighth region 752, and a ninth region 753. The seventh region 771 has one end in the z direction connected to the top surface 71 and the other end in the z direction connected to the ninth region 753. The seventh region 751 is inclined with respect to the top surface 71. The eighth region 752 has one end in the z direction connected to the bottom surface 72 and the other end in the z direction connected to the ninth region 753. The eighth region 752 is inclined with respect to the bottom surface 72. The ninth region 753 has one end in the z direction connected to the seventh region 751 and the other end in the z direction connected to the eighth region 752. The ninth region 753 extends parallel to the z direction and the y direction. As viewed in the z direction, the ninth region 753 is located outside the top surface 71 and the bottom surface 72.

As shown in FIGS. 4 to 6, the fourth side surface 76 includes a tenth region 761, an eleventh region 762, and a twelfth region 763. The tenth region 761 has one end in the z direction connected to the top surface 71 and the other end in the z direction connected to the twelfth region 763. The tenth region 761 is inclined with respect to the top surface 71. The eleventh region 762 has one end in the z direction connected to the bottom surface 72 and the other end in the z direction connected to the twelfth region 763. The eleventh region 762 is inclined with respect to the bottom surface 72. The twelfth region 763 has one end in the z direction connected to the tenth region 761 and the other end in the z direction connected to the eleventh region 762. The twelfth region 763 extends parallel to the z direction and the y direction. As viewed in the z direction, the twelfth region 763 is located outside the top surface 71 and the bottom surface 72.

Figure 13:
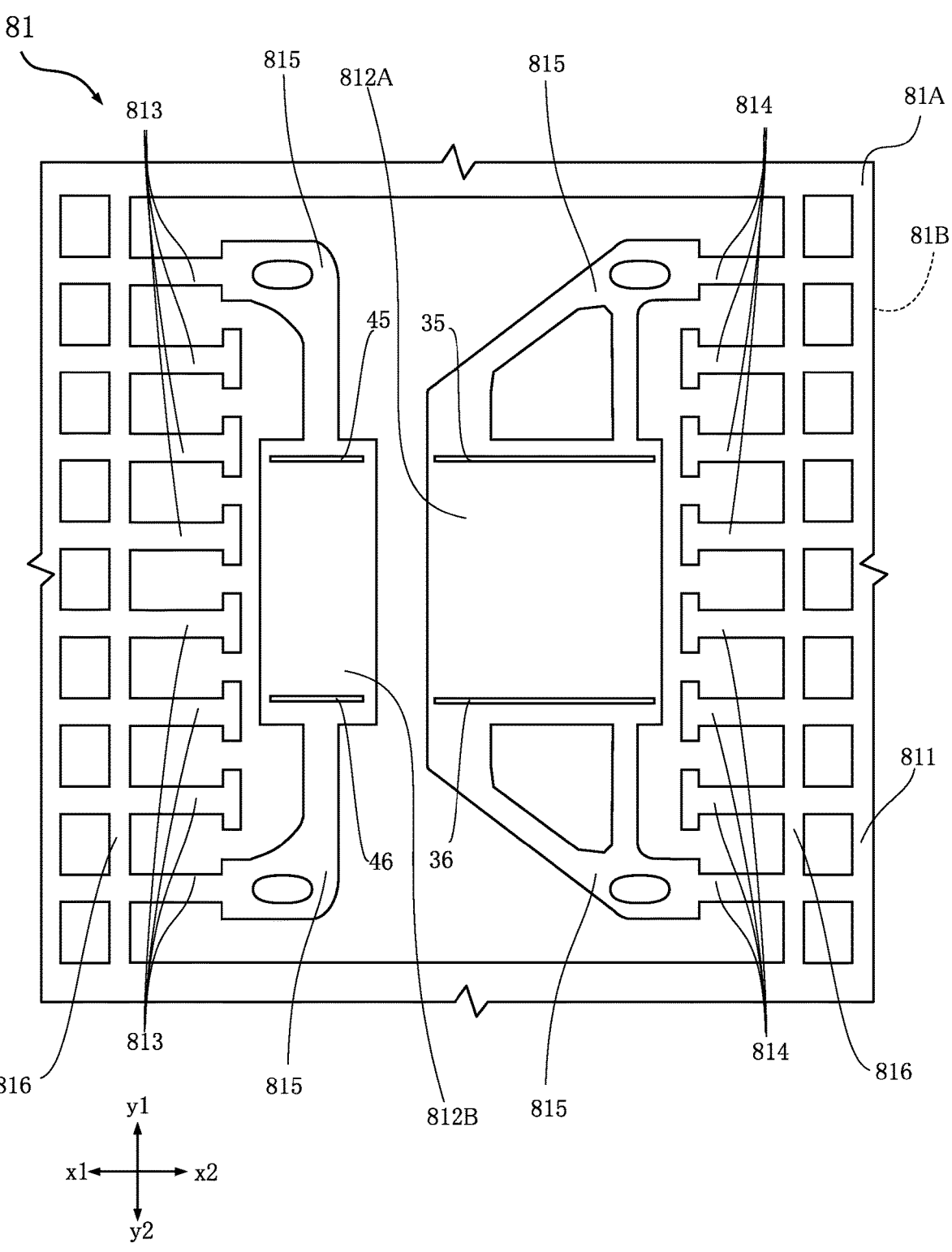
FIG. 13 is a plan view showing a step of a method for manufacturing the semiconductor device of FIG. 1.
Figure 14:
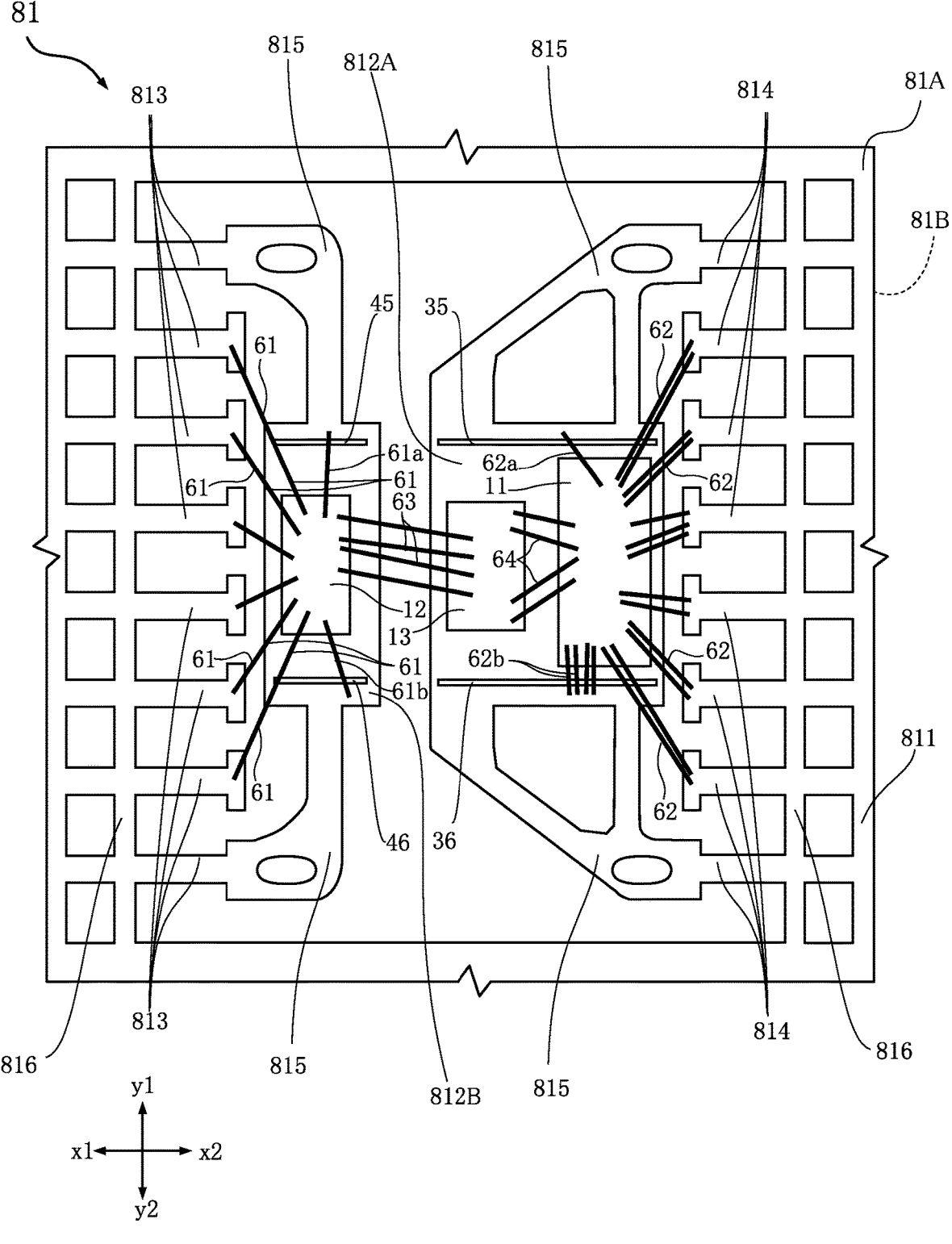
FIG. 14 is a plan view showing a step of the method for manufacturing the semiconductor device of FIG. 1.

A method for manufacturing the semiconductor device A10 is described below with reference to FIGS. 13 and 14. FIGS. 13 and 14 are plan views each illustrating a process of the manufacturing method of the semiconductor device A10. The x direction, the y direction and the z direction shown in these figures coincide with those shown in FIGS. 1 to 12.

First, a lead frame 81 is prepared. The lead frame 81 is a plate. In the present embodiment, the base material of the lead frame 81 is Cu. The lead frame 81 may be made by etching a metal plate or may be made by punching a metal plate. In the present embodiment, the lead frame 81 is made through an etching process. The lead frame 81 has an obverse surface 81A and a reverse surface 81B spaced apart from each other in the z direction. The lead frame 81 has an outer frame 811, a first die pad 812A, a second die pad 812B, a plurality of first leads 813, a plurality of second leads 814, a plurality of connecting portions 815, and a dam bar 816. The outer frame 811 and the dam bar 816 are not to later form parts of the semiconductor device A10. The first die pad 812A is to later become the first die pad 3. The second die pad 812B is to later become the second die pad 4. The first leads 813 are to later become the input-side terminals 51 and the pad portions 53. The second leads 814 are to later become the output-side terminals 52 and the pad portions 55. The connecting portions 815 are to later become the pair of connecting portions 54 and the pair of connecting portions 56. The first die pad 812A is formed with a first opening 35 and a second opening 36. The first opening 35 and the second opening 36 are formed by half etching. The second die pad 812B is formed with a third opening 45 and a fourth opening 46. The third opening 45 and the fourth opening 46 are formed by half etching. The technique to form the first opening 35, the second opening 36, the third opening 45 and the fourth opening 46 (which may be hereinafter described as "each opening 35, 36, 45, 46") is not limited. Each opening 35, 36, 45, 46 may be formed by denting the obverse surface 81A through stamping.

Next, as shown in FIG. 14, the first semiconductor element 11 and the insulating element 13 are bonded to the first die pad 812A with a bonding layer 69, and the second semiconductor element 12 is bonded to the second die pad 812B with a bonding layer 69. In this bonding process, a bonding material in a paste state, which is the bonding layer 69 before solidification, is applied to the regions of the first die pad 812A at which the first semiconductor element 11 and the insulating element 13 are to be disposed and the region of the second die pad 812B at which the second semiconductor element 12 is to be disposed. Next, the first semiconductor element 11, the second semiconductor element 12, and the insulating element 13 are placed on the applied bonding material. Next, the bonding material is melted and then solidified through reflowing. When the molten bonding material flows out during this process, each opening 35, 36, 45, 46 prevents the bonding material from flowing to the outside of the opening.

Next, as shown in FIG. 14, a plurality of wires 61 to 64 are formed through wire bonding. In the process of forming the wires 61 other than wires 61a and 61b, a capillary is first lowered toward the second semiconductor element 12, and the tip of the wire is pressed against a relevant electrode. The tip of the wire is bonded to the electrode due to the actions of the weight of the capillary, the ultrasonic waves emitted from the capillary, and so on, thereby the first bonding is completed. The capillary is then raised while feeding the wire to form a ball bond on the electrode. The capillary is then moved to a position directly above a portion of one of the first leads 813 which is to become a pad portion 53 and then lowered to press the tip of the capillary against the bond surface. Thus, the wire is sandwiched between the tip of the capillary and the bond surface and pressed for bonding to the bond surface, thereby the second bonding is completed. Next, the capillary is raised to cut the wire.

In the process of forming the wire 61a, first bonding is performed to an electrode of the second semiconductor element 12, and second bonding is performed to a region between the end of the second die pad 812B on the y1 side in the y direction and the third opening 45. In the process of forming the wire 61b, first bonding is performed to an electrode of the second semiconductor element 12, and second bonding is performed to a region between the end of the second die pad 812B on the y2 side in the y direction and the fourth opening 46.

In the process of forming the wires 62 other than wires 62a and 62b, first bonding is performed to an electrode of the first semiconductor element 11, and second bonding is performed to a portion of one of the second leads 814 which is to become a pad portion 55. In the process of forming the wire 62a, first bonding is performed to an electrode of the first semiconductor element 11, and second bonding is performed to a region between the end of the first die pad 812A on the y1 side in the y direction and the first opening 35. In the process of forming the wire 62b, first bonding is performed to an electrode of the first semiconductor element 11, and second bonding is performed to a region between the end of the first die pad 812A on the y2 side in the y direction and the second opening 36.

In the process of forming the wires 63, first bonding is performed to the electrodes of the insulating element 13, and second bonding is performed to the electrodes of the second semiconductor element 12. In the process of forming the wires 64, first bonding is performed to the electrodes of the insulating element 13, and second bonding is performed to the electrodes of the first semiconductor element 11. For each of the wires 61 to 64, the first bonding and the second bonding may be performed in a way opposite from the above.

Next, a sealing resin 7 is formed. The sealing resin 7 is formed by transfer molding. In this process, the lead frame 81 is placed in a mold having a plurality of cavities. Specifically, the lead frame 81 is placed such that each portion of the conductive support member 2 to be covered later by the sealing resin 7 of a produced semiconductor device A10 is located within a corresponding one of the cavities. Thereafter, molten resin is introduced from a pot into each of the cavities through a runner. After the molten resin in the cavities is solidified to form the sealing resin 7, resin burrs remaining outside the cavities are removed by, for example, applying high-pressure water jet. In this way, formation of the sealing resin 7 is completed.

Thereafter, dicing is performed for separation into individual pieces, whereby the first leads 813 and the second leads 814 connected to each other by the outer frame 811 and the dam bar 816 are separated as appropriate. In this way, the semiconductor device A10 is manufactured.

The advantages of the semiconductor device A10 are described below.

According to the present embodiment, the first die pad 3 has the first opening 35 located between the first bond portion 33 and the first semiconductor element 11 in the y direction. In the manufacturing process, when the molten bonding material flows out during the bonding of the first semiconductor element 11 and the insulating element 13 to the first die pad 812A, the first opening 35 prevents the bonding material from flowing to the first bond portion 33. This prevents the bonding material solidified into the bonding layer 69 from interfering with the bonding of the wire 62a. Moreover, when the sealing resin 7 separates from the first die pad 3 due to the stress of the heat generated by the first semiconductor element 11 and the insulating element 13, the first opening 35 prevents such separation from spreading to the first bond portion 33.

According to the present embodiment, the first die pad 3 has the second opening 36 located between the second bond portions 34 and the first semiconductor element 11 in the y direction. In the manufacturing process, when the molten bonding material flows out during the bonding of the first semiconductor element 11 and the insulating element 13 to the first die pad 812A, the second opening 36 prevents the bonding material from flowing to the second bond portions 34. This prevents the bonding material solidified into the bonding layer 69 from interfering with the bonding of each wire 62b. Moreover, when the sealing resin 7 separates from the first die pad 3 due to the stress of the heat generated by the first semiconductor element 11 and the insulating element 13, the second opening 36 prevents such separation from spreading to the second bond portions 34.

According to the present embodiment, the second die pad 4 has the third opening 45 located between the third bond portion 43 and the second semiconductor element 12 in the y direction. In the manufacturing process, when the molten bonding material flows out during the bonding of the second semiconductor element 12 to the second die pad 812B, the third opening 45 prevents the bonding material from flowing to the third bond portion 43. This prevents the bonding material solidified into the bonding layer 69 from interfering with the bonding of the wire 61a. Moreover, when the sealing resin 7 separates from the second die pad 4 due to the stress of the heat generated by the second semiconductor element 12, the third opening 45 prevents such separation from spreading to the third bond portion 43.

According to the present embodiment, the second die pad 4 has the fourth opening 46 located between the fourth bond portion 44 and the second semiconductor element 12 in the y direction. In the manufacturing process, when the molten bonding material flows out during the bonding of the second semiconductor element 12 to the second die pad 812B, the fourth opening 46 prevents the bonding material from flowing to the fourth bond portion 44. This prevents the bonding material solidified into the bonding layer 69 from interfering with the bonding of the wire 61b. Moreover, when the sealing resin 7 separates from the second die pad 4 due to the stress of the heat generated by the second semiconductor element 12, the fourth opening 46 prevents such separation from spreading to the fourth bond portion 44.

In the present embodiment, the first opening 35 overlaps with the entirety of the first semiconductor element 11 as viewed in the y direction. Such a configuration is more effective in preventing the outflow of the bonding material for bonding the first semiconductor element 11 and preventing the spread of the separation of the sealing resin 7, as compared with the case in which the opening does not overlap with the entirety of the first semiconductor element 11. Also, the first opening 35 overlaps with the entirety of the insulating element 13 as viewed in the y direction. Such a configuration is more effective in preventing the outflow of the bonding material for bonding the insulating element 13 and preventing the spread of the separation of the sealing resin 7, as compared with the case in which the opening does not overlap with the entirety of the insulating element 13. This holds for the second opening 36, the third opening 45, and the fourth opening 46.

According to the present embodiment, the first opening 35 does not extend to the outer edge of the first obverse surface 31. Thus, the first die pad 3 can be made stronger as compared with the case in which the first opening 35 extends to the outer edge of the first obverse surface 31. This holds for the second opening 36, the third opening 45, and the fourth opening 46.

In the present embodiment, the first opening 35 is located closer to the first bond portion 33 than to the first semiconductor element 11. Such a configuration is more effective in preventing the outflow of the bonding material for bonding the first semiconductor element 11 as compared with the case in which the first opening 35 is closer to the first semiconductor element 11. This holds for the second opening 36, the third opening 45, and the fourth opening 46.

According to the present embodiment, the width W3 of the first opening 35 is not less than 100 μm and not more than 250 μm and may be about 110 μm. This is suitable for preventing the outflow of the bonding material and the spread of the separation of the sealing resin 7. Moreover, such a dimension secures the area for bonding the wire 62a even when the dimension of the first obverse surface 31 in the y direction is small. This holds for the second opening 36, the third opening 45, and the fourth opening 46.

In the present embodiment, each opening 35, 36, 45, 46 is a groove recessed from the first obverse surface 31 or the second obverse surface 41 in the z direction. Such a configuration allows making the openings relatively small in dimension in the y direction as compared with the case in which the openings penetrate the first die pad 3 or the second die pad 4. This is particularly advantageous when the dimensions of the first die pad 3 and the second die pad 4 in the y-direction are small.

As described above, the first die pad 3 has the first opening 35 and the second opening 36, whereas the second die pad 4 has the third opening 45 and the fourth opening 46 in the present embodiment, but the present disclosure is not limited to this. The semiconductor device A10 does not necessarily need to have all of the opening 35, 36, 45 and 46 and may have at least one of these.

FIGS. 15 to 21 illustrate other embodiments of the present disclosure. In these figures, the elements identical or similar to those of the foregoing embodiment are denoted by the same reference signs as those used for the foregoing embodiment.

Figure 15:
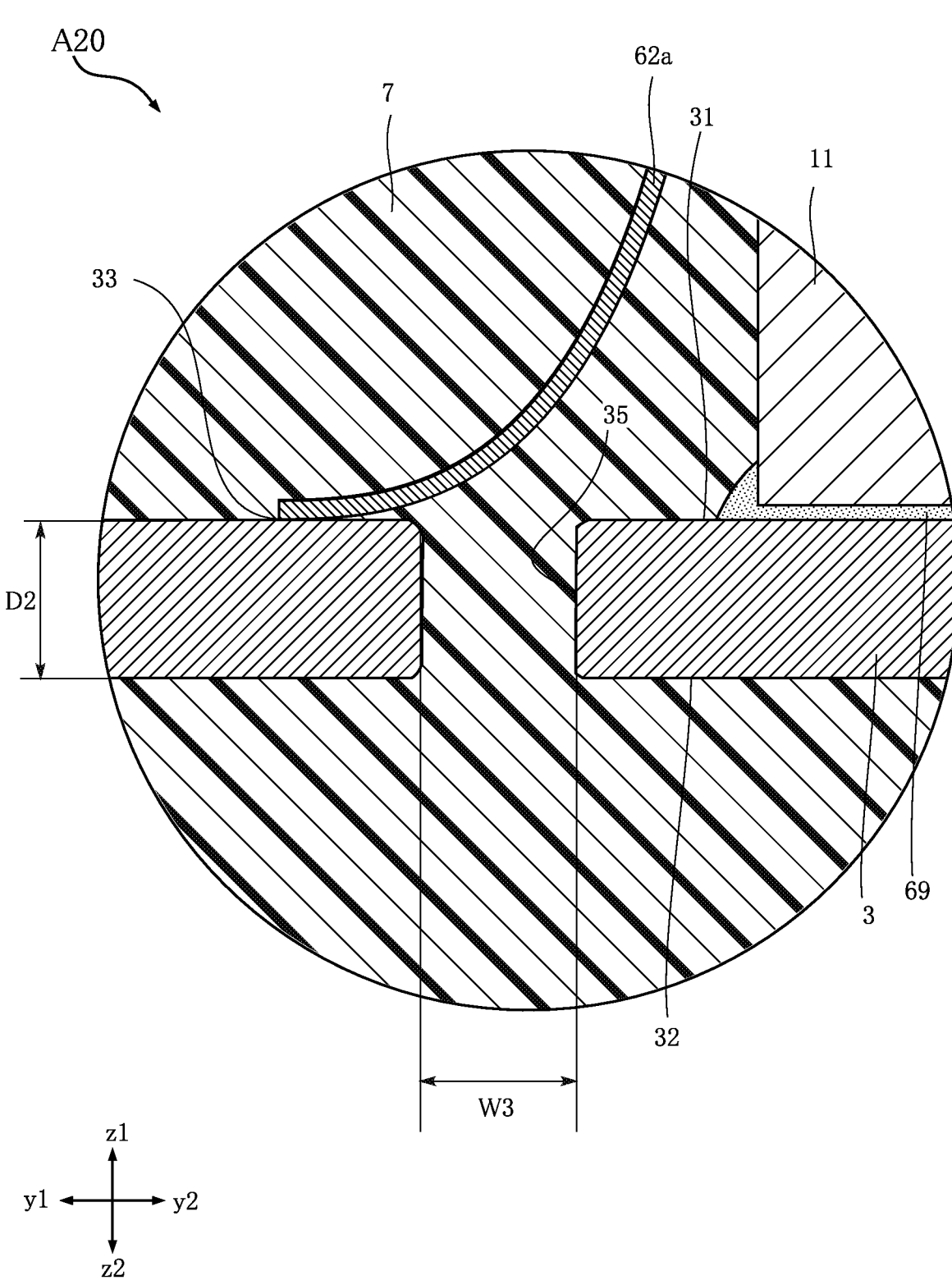
FIG. 15 is an enlarged sectional view showing a part of a semiconductor device according to a second embodiment of the present disclosure.
Figure 16:
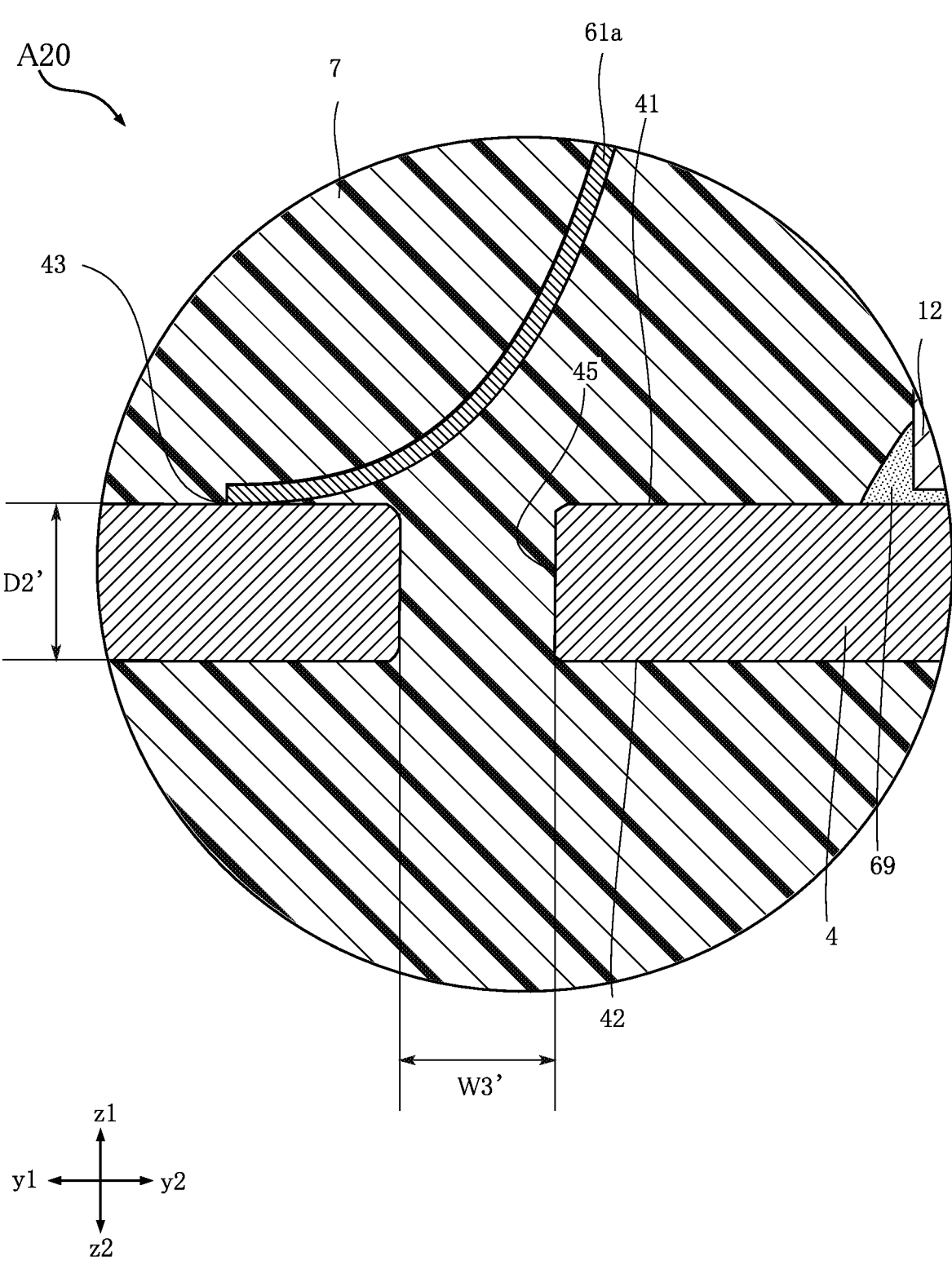
FIG. 16 is an enlarged sectional view showing a part of the semiconductor device according to the second embodiment of the present disclosure.

FIGS. 15 and 16 are views of a semiconductor device A20 according to a second embodiment of the present disclosure. FIG. 15 is an enlarged sectional of a part of the semiconductor device A20 and corresponds to FIG. 11. FIG. 16 is an enlarged sectional of a part of the semiconductor device A20 and corresponds to FIG. 12. The semiconductor device A20 of the present embodiment differs from the first embodiment in shape of each opening 35, 36, 45, 46.

In the present embodiment, the first opening 35 penetrates the first die pad 3 in the z direction, as shown in FIG. 15. The second opening 36 also penetrates the first die pad 3 in the z direction. In the present embodiment, the width W3 of the first opening 35 is approximately equal to the thickness D2 of the first die pad 3. In the present embodiment, the thickness D2 of the first die pad 3 is about 220 μm, and the width W3 of the first opening 35 is also about 220 μm. The width of the second opening 36 is approximately equal to the width W3 of the first opening 35. The dimensions of the first opening 35 and the second opening 36 are not limited to those described above.

In the present embodiment, the third opening 45 penetrates the second die pad 4 in the z direction, as shown in FIG. 16. The fourth opening 46 also penetrates the second die pad 4 in the z direction. In the present embodiment, the width W3' of the third opening 45 is approximately equal to the thickness D2' of the second die pad 4. In the present embodiment, the thickness D2' of the second die pad 4 is about 220 μm, and the width W3' of the third opening 45 is also about 220 μm. The width of the fourth opening 46 is approximately equal to the width W3' of the third opening 45. The dimensions of the third opening 45 and the fourth opening 46 are not limited to those described above.

In the present embodiment again, when the molten bonding material flows out during the manufacturing process, the first opening 35 prevents the bonding material from flowing to the first bond portion 33. This prevents the bonding material solidified into the bonding layer 69 from interfering with the bonding of the wire 62*a*. Moreover, when the sealing resin 7 separates from the first die pad 3, the first opening 35 prevents such separation from spreading to the first bond portion 33. The second opening 36, the third opening 45, and the fourth opening 46 act in the same manner. The semiconductor device A20 has a configuration similar to the semiconductor device A10 and hence has the same advantages as the semiconductor device A10. In the present embodiment, each opening 35, 36, 45, 46 penetrates the first die pad 3 or the second die pad 4 in the z direction. Each opening 35, 36, 45, 46 prevents the outflow of the bonding material more effectively than in the case in which they do not penetrate the first die pad 3 or the second die pad 4.

Figure 17:
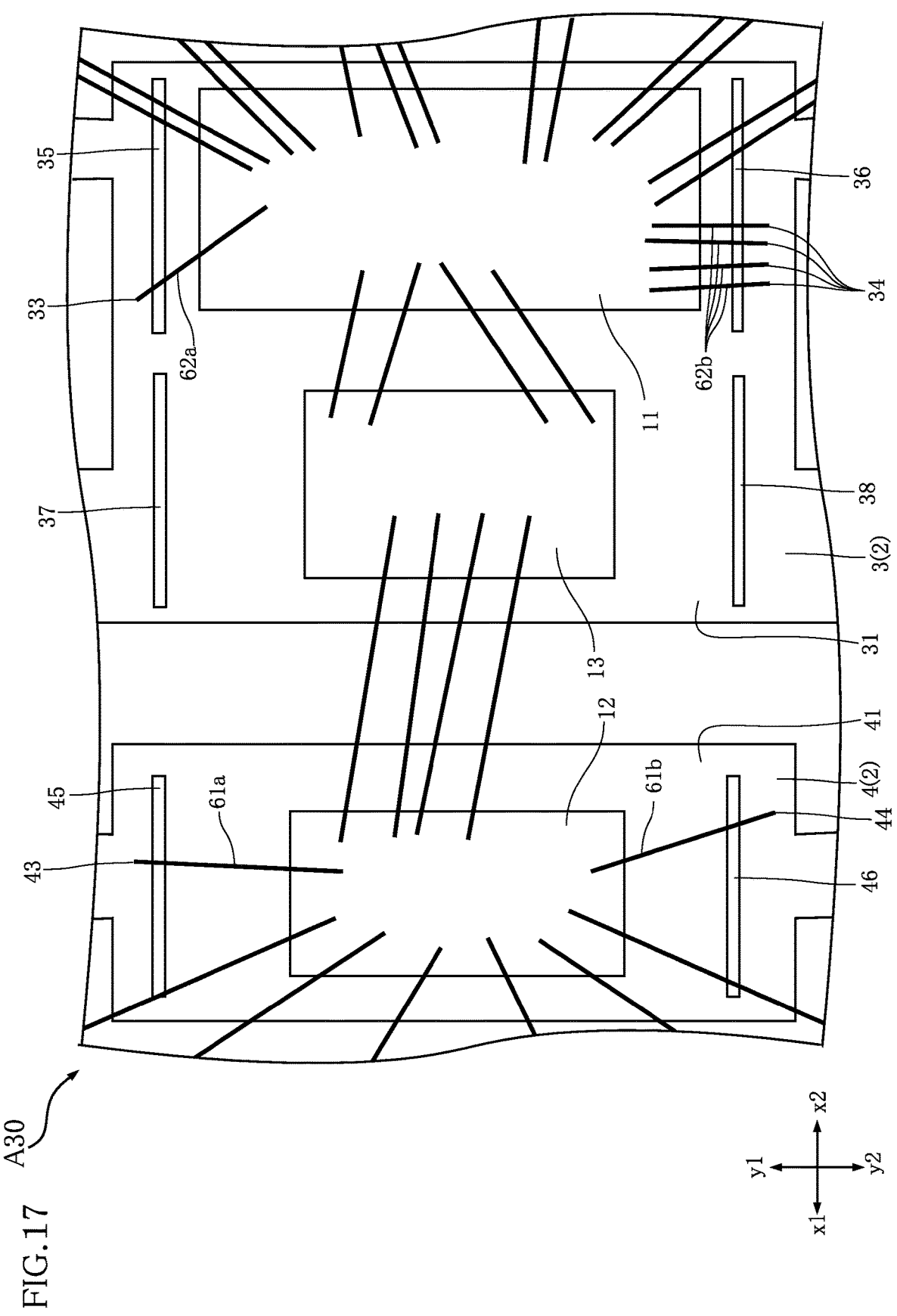
FIG. 17 is an enlarged plan view showing a part of a semiconductor device according to a third embodiment of the present disclosure, as seen through a sealing resin.

FIG. 17 is a view of a semiconductor device A30 according to a third embodiment of the present disclosure. FIG. 17 is an enlarged plan view of a part of the semiconductor device A30 and corresponds to FIG. 7. In FIG. 17, the sealing resin 7 is illustrated as transparent for convenience of understanding. The semiconductor device A30 of the present embodiment differs from the first embodiment in that the dimension of the first opening 35 and the second opening 36 in the x direction is smaller and that the semiconductor device A30 further includes a fifth opening 37 and a sixth opening 38.

In the present embodiment, the first opening 35 is smaller in dimension in the x direction than that of the first embodiment. In the x direction, the end on the x1 side of the first opening 35 is located between the end surface of the first semiconductor element 11 on the x1 side and the end surface of the insulating element 13 on the x2 side. That is, as viewed in the y direction, the first opening 35 overlaps with the entirety of the first semiconductor element 11 but does not overlap with the insulating element 13. The first die pad 3 further includes the fifth opening 37. As with the first opening 35, the fifth opening 37 has an opening end in the first obverse surface 31, and is a groove recessed from the first obverse surface 31 in the z direction in the present embodiment. The fifth opening 37 is elongated in the x direction. In the x direction, the end on the x2 side of the fifth opening 37 is located between the end surface of the first semiconductor element 11 on the x1 side and the end surface of the insulating element 13 on the x2 side. In the x direction, the end on the x1 side of the fifth opening 37 is located between the end surface of the insulating element 13 on the x1 side and the outer edge of the first obverse surface 31 on the x1 side. That is, as viewed in the y direction, the fifth opening 37 overlaps with the entirety of the insulating element 13. The first opening 35 and the fifth opening 37 of the present invention correspond to the first opening 35 of the first embodiment as divided into two parts in the x direction.

In the present embodiment, the second opening 36 is also smaller in dimension in the x direction than that of the first embodiment. In the x direction, the end on the x1 side of the second opening 36 is located between the end surface of the first semiconductor element 11 on the x1 side and the end surface of the insulating element 13 on the x2 side. That is, as viewed in the y direction, the second opening 36 overlaps with the entirety of the first semiconductor element 11 but does not overlap with the insulating element 13. The first die pad 3 further includes the sixth opening 38. As with the second opening 36, the sixth opening 38 has an opening end in the first obverse surface 31, and is a groove recessed from the first obverse surface 31 in the z direction in the present embodiment. The sixth opening 38 is elongated in the x direction. In the x direction, the end on the x2 side of the sixth opening 38 is located between the end surface of the first semiconductor element 11 on the x1 side and the end surface of the insulating element 13 on the x2 side. In the x direction, the end on the x1 side of the sixth opening 38 is located between the end surface of the insulating element 13 on the x1 side and the outer edge of the first obverse surface 31 on the x1 side. That is, as viewed in the y direction, the sixth opening 38 overlaps with the entirety of the insulating element 13. The second opening 36 and the sixth opening 38 of the present embodiment correspond to the second opening 36 of the first embodiment as divided into two parts in the x direction.

In the present embodiment again, when the molten bonding material flows out during the manufacturing process, the first opening 35 and the fifth opening 37 prevent the bonding material from flowing to the first bond portion 33. This prevents the bonding material solidified into the bonding layer 69 from interfering with the bonding of the wire 62*a*.

Moreover, when the sealing resin 7 separates from the first die pad 3, the first opening 35 and the fifth opening 37 prevent such separation from spreading to the first bond portion 33. The second opening 36 and the sixth opening 38 act in the same manner. The semiconductor device A30 has a configuration similar to the semiconductor device A10 and hence has the same advantages as the semiconductor device A10.

Figure 18:
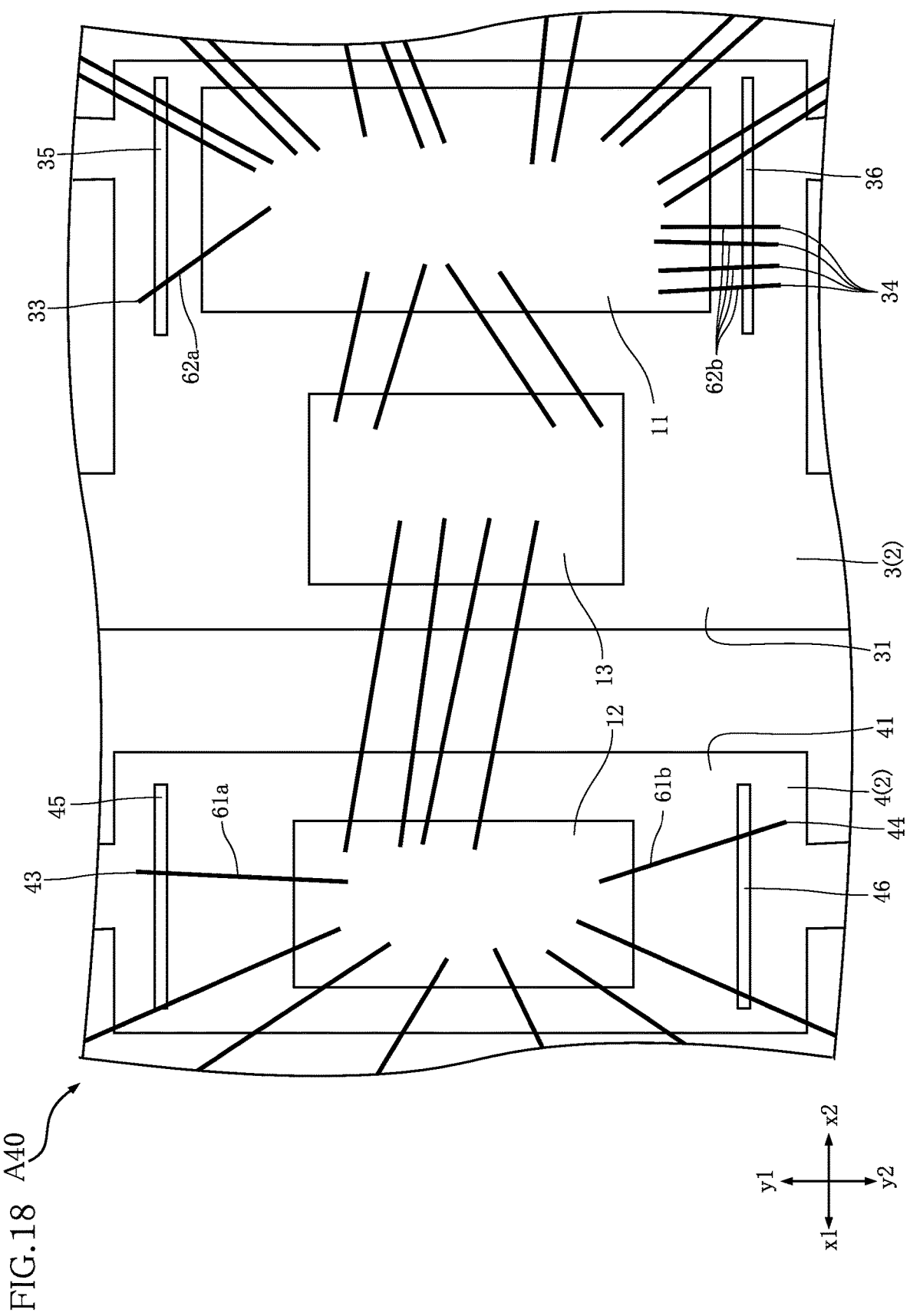
FIG. 18 is an enlarged plan view showing a part of a semiconductor device according to a fourth embodiment of the present disclosure, as seen through a sealing resin.

FIG. 18 is a view of a semiconductor device A40 according to a fourth embodiment of the present disclosure. FIG. 18 is an enlarged plan view of a part of the semiconductor device A40 and corresponds to FIG. 7. In FIG. 18, the sealing resin 7 is illustrated as transparent for convenience of understanding. The semiconductor device A40 of the present embodiment differs from the first embodiment in that the dimension of the first opening 35 and the second opening 36 in the x direction is smaller.

In the present embodiment, the first opening 35 is smaller in dimension in the x direction than that of the first embodiment. In the x direction, the end on the x1 side of the first opening 35 of the present embodiment is located between the end surface of the first semiconductor element 11 on the x1 side and the end surface of the insulating element 13 on the x2 side. That is, as viewed in the y direction, the first opening 35 overlaps with the entirety of the first semiconductor element 11 but does not overlap with the insulating element 13. In the present embodiment, the second opening 36 is also smaller in dimension in the x direction than that of the first embodiment. In the x direction, the end on the x1 side of the second opening 36 of the present embodiment is located between the end surface of the first semiconductor element 11 on the x1 side and the end surface of the insulating element 13 on the x2 side. That is, as viewed in the y direction, the second opening 36 overlaps with the entirety of the first semiconductor element 11 but does not overlap with the insulating element 13.

In the present embodiment again, when the molten bonding material flows out during the manufacturing process, the first opening 35 prevents the bonding material from flowing to the first bond portion 33. This prevents the bonding material solidified into the bonding layer 69 from interfering with the bonding of the wire 62a. Moreover, when the sealing resin 7 separates from the first die pad 3, the first opening 35 prevents such separation from spreading to the first bond portion 33. The second opening 36 acts in the same manner. The semiconductor device A40 has a configuration similar to the semiconductor device A10 and hence has the same advantages as the semiconductor device A10. In addition, because the first opening 35 and the second opening 36 are smaller in dimension in the x direction than those of the first embodiment, the first die pad 3 can be made stronger.

Figure 19:
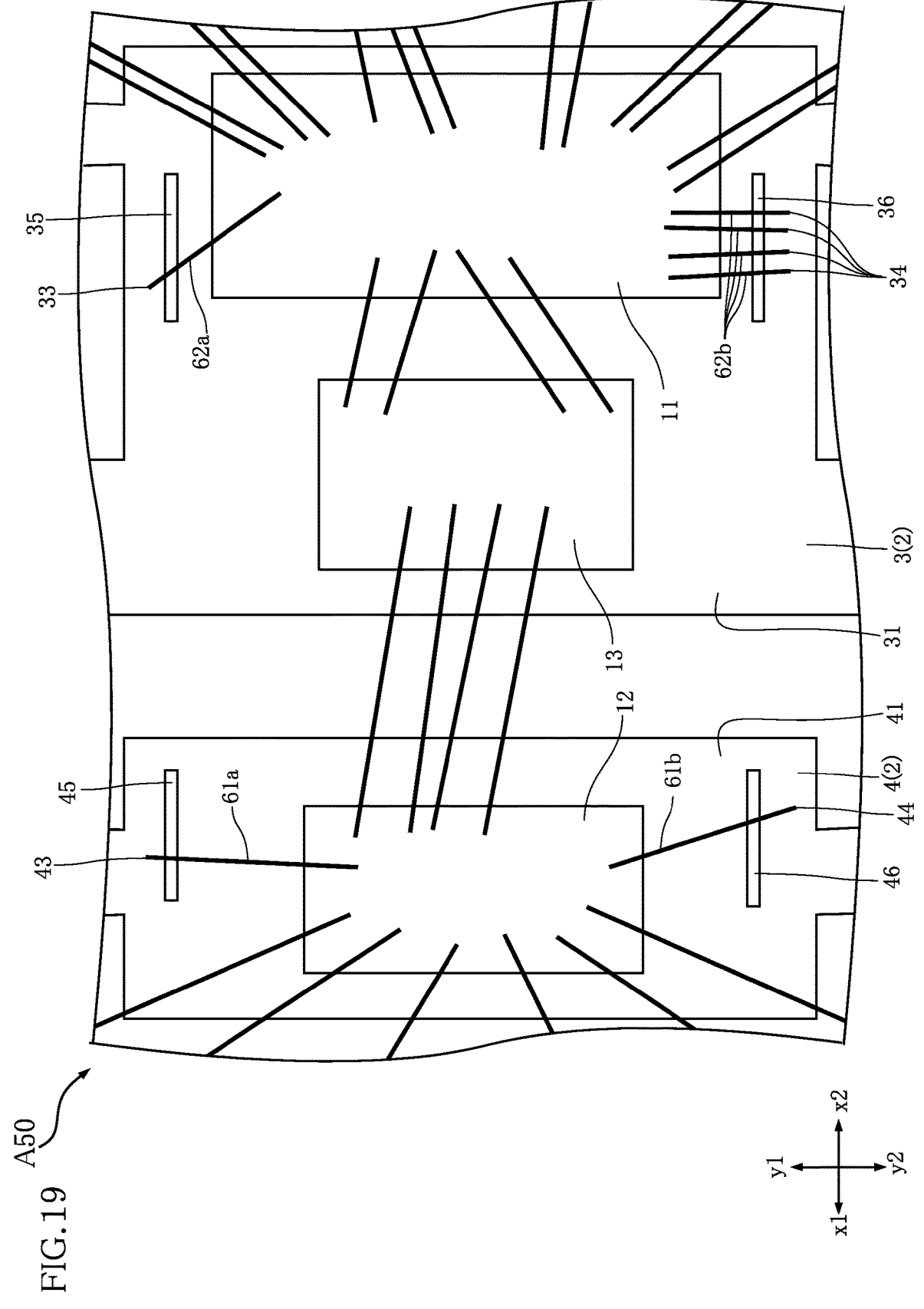
FIG. 19 is an enlarged plan view showing a part of a semiconductor device according to a fifth embodiment of the present disclosure, as seen through a sealing resin.

FIG. 19 is a view of a semiconductor device A50 according to a fifth embodiment of the present disclosure. FIG. 19 is an enlarged plan view of a part of the semiconductor device A50 and corresponds to FIG. 7. In FIG. 19, the sealing resin 7 is illustrated as transparent for convenience of understanding. The semiconductor device A50 of the present embodiment differs from the first embodiment in that the dimension of each opening 35, 36, 45, 46 in the x direction is smaller.

In the present embodiment, each opening 35, 36, 45, 46 is smaller in dimension in the x direction than in the first embodiment. In the x direction, the end on the x1 side of the first opening 35 of the present embodiment is located between the end surface of the first semiconductor element 11 on the x1 side and the end surface of the insulating element 13 on the x2 side. The end on the x2 side of the first opening 35 is located at the center (or approximately at the center) of the first semiconductor element 11 in the x direction. In the x direction, the end on the x1 side of the second opening 36 of the present embodiment is located between the end surface of the first semiconductor element 11 on the x1 side and the end surface of the insulating element 13 on the x2 side. The end on the x2 side of the second opening 36 is located at the center (or approximately at the center) of the first semiconductor element 11 in the x direction.

In the x direction, the end on the x2 side of the third opening 45 of the present embodiment is located between the end surface of the second semiconductor element 12 on the x2 side and the outer edge of the second obverse surface 41 on the x2 side. The end on the x1 side of the third opening 45 is located at the center (or approximately at the center) of the second semiconductor element 12 in the x direction. In the x direction, the end on the x2 side of the fourth opening 46 of the present embodiment is located between the end surface of the second semiconductor element 12 on the x2 side and the outer edge of the second obverse surface 41 on the x2 side. The end on the x1 side of the fourth opening 46 is located at the center (or approximately at the center) of the second semiconductor element 12 in the x direction.

In the present embodiment again, when the molten bonding material flows out during the manufacturing process, the first opening 35 prevents the bonding material from flowing to the first bond portion 33. This prevents the bonding material solidified into the bonding layer 69 from interfering with the bonding of the wire 62a. Moreover, when the sealing resin 7 separates from the first die pad 3, the first opening 35 prevents such separation from spreading to the first bond portion 33. The second opening 36, the third opening 45, and the fourth opening 46 act in the same manner. The semiconductor device A50 has a configuration similar to the semiconductor device A10 and hence has the same advantages as the semiconductor device A10. In addition, because each opening 35, 36, 45, 46 is smaller in dimension in the x direction than those of the first embodiment, the first die pad 3 and the second die pad 4 can be made stronger.

Figure 20:
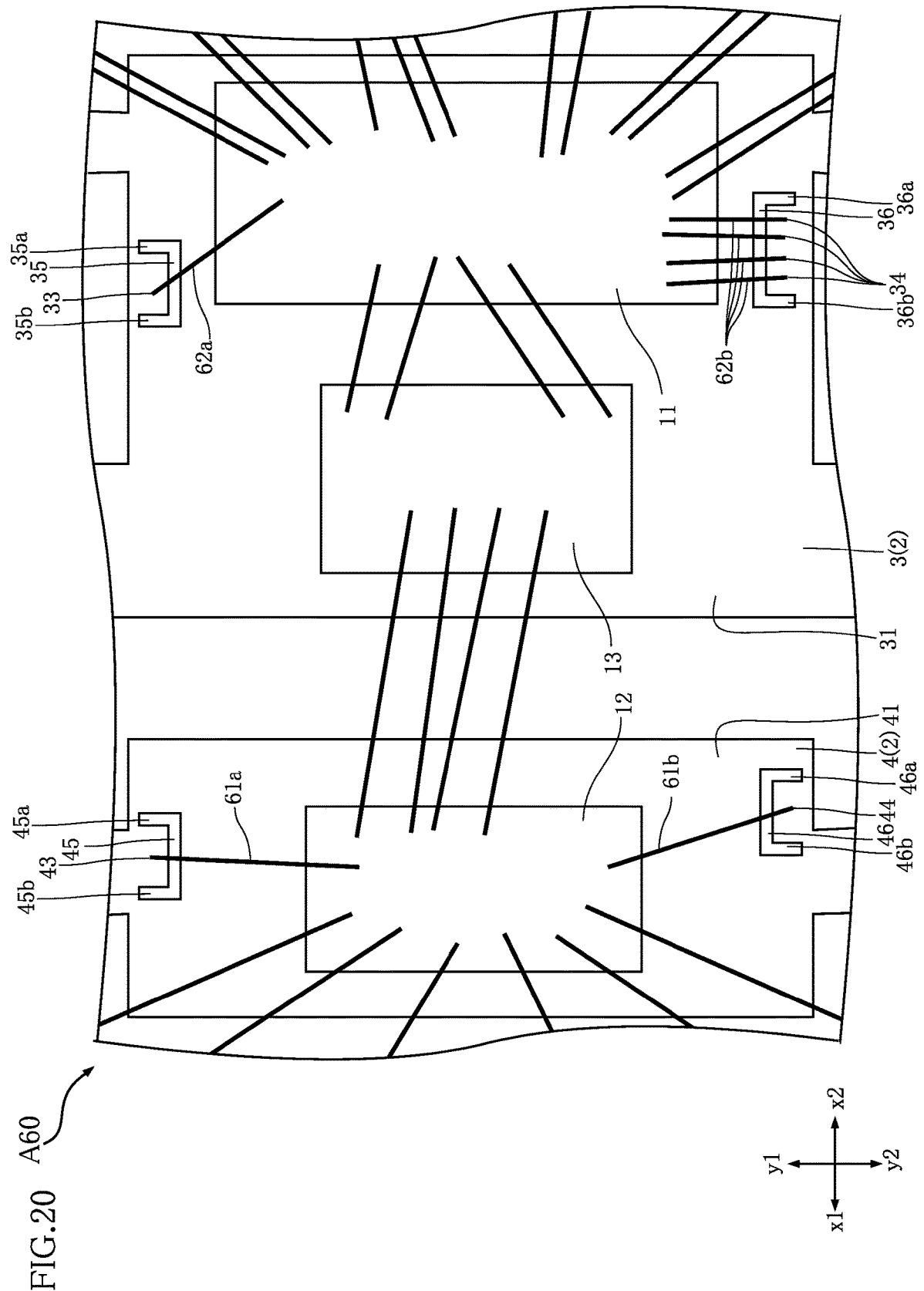
FIG. 20 is an enlarged plan view showing a part of a semiconductor device according to a sixth embodiment of the present disclosure, as seen through a sealing resin.

FIG. 20 is a view of a semiconductor device A60 according to a sixth embodiment of the present disclosure. FIG. 20 is an enlarged plan view of a part of the semiconductor device A60 and corresponds to FIG. 7. In FIG. 20, the sealing resin 7 is illustrated as transparent for convenience of understanding. The semiconductor device A60 of the present embodiment differs from the first embodiment in shape of each opening 35, 36, 45, 46.

In the present embodiment, the first opening 35 is smaller in dimension in the x direction than that of the first embodiment. The first die pad 3 of the present embodiment further includes an additional opening 35a and an additional opening 35b. Both of the additional openings 35a and 35b have opening ends in the first obverse surface 31 and are grooves recessed from the first obverse surface 31 in the z direction. The additional opening 35a extends from the end of the first opening 35 on the x2 side in the x direction toward the y1 side in the y direction, and its extremity is located inward from the outer edge of the first obverse surface 31. The additional opening 35b extends from the end of the first opening 35 on the x1 side in the x direction toward the y1 side in the y direction, and its extremity is located inward from the outer edge of the first obverse surface 31. In the present embodiment, the distance between the extremity of each of the additional openings 35a and 35b and the outer edge of the first obverse surface 31 is not less than 50 μm and not more than 200 μm and may be about 150 μm, for example. Each of the additional openings 35a and 35b has the depth (the dimension in the z direction) that is approximately equal to the depth D1 of the first opening 35 and the width (the dimension in the x direction) that is approximately equal to the width W3 of the first opening 35. As viewed in the z direction, the first opening 35, the additional opening 35a and the additional opening 35b enclose the first bond portion 33.

The second opening 36 is also smaller in dimension in the x direction than that of the first embodiment. The first die pad 3 further includes an additional opening 36a and an additional opening 36b. Both of the additional openings 36a and 36b have opening ends in the first obverse surface 31 and are grooves recessed from the first obverse surface 31 in the z direction. The additional opening 36a extends from the end of the second opening 36 on the x2 side in the x direction toward the y2 side in the y direction, and its extremity is located inward from the outer edge of the first obverse surface 31. The additional opening 36b extends from the end of the second opening 36 on the x1 side in the x direction toward the y2 side in the y direction, and its extremity is located inward from the outer edge of the first obverse surface 31. In the present embodiment, the distance between the extremity of each of the additional openings 36a and 36b and the outer edge of the first obverse surface 31 is not less than 50 μm and not more than 200 μm and may be about 150 μm, for example. Each of the additional openings 36a and 36b has the depth (the dimension in the z direction) that is approximately equal to the depth of the second opening 36 and the width (the dimension in the x direction) that is approximately equal to the width of the second opening 36. As viewed in the z direction, the second opening 36, the additional opening 36a and the additional opening 36b enclose all of the second bond portions 34.

In the present embodiment, the third opening 45 is smaller in dimension in the x direction than that of the first embodiment. The second die pad 4 of the present embodiment further includes an additional opening 45a and an additional opening 45b. Both of the additional opening 45a and the additional opening 45b have opening ends in the second obverse surface 41 and are grooves recessed from the second obverse surface 41 in the z direction. The additional opening 45a extends from the end of the third opening 45 on the x2 side in the x direction toward the y1 side in the y direction, and its extremity is located inward from the outer edge of the second obverse surface 42. The additional opening 45b extends from the end of the third opening 45 on the x1 side in the x direction toward the y3 side in the y direction, and its extremity is located inward from the outer edge of the second obverse surface 41. In the present embodiment, the distance between the extremity of each of the additional openings 45a and 45b and the outer edge of the second obverse surface 41 is not less than 50 μm and not more than 200 μm and may be about 150 μm, for example. Each of the additional openings 45a and 45b has the depth (the dimension in the z direction) that is approximately equal to the depth D1' of the third opening 45 and the width (the dimension in the x direction) that is approximately equal to the width W3' of the third opening 45. As viewed in the z direction, the third opening 45, the additional opening 45a and the additional opening 45b enclose the third bond portion 43.

The fourth opening 46 is also smaller in dimension in the x direction than that of the first embodiment. The second die pad 4 further includes an additional opening 46a and an additional opening 46b. Both of the additional opening 46a and the additional opening 46b have opening ends in the second obverse surface 41 and are grooves recessed from the second obverse surface 41 in the z direction. The additional opening 46a extends from the end of the fourth opening 46 on the x2 side in the x direction toward the y2 side in the y direction, and its extremity is located inward from the outer edge of the second obverse surface 41. The additional opening 46b extends from the end of the fourth opening 46 on the x1 side in the x direction toward the y2 side in the y direction, and its extremity is located inward from the outer edge of the second obverse surface 41. In the present embodiment, the distance between the extremity of each of the additional openings 46a and 46b and the outer edge of the second obverse surface 41 is not less than 50 μm and not more than 200 μm and may be about 150 μm, for example. Each of the additional openings 46a and 46b has the depth (the dimension in the z direction) that is approximately equal to the depth of the fourth opening 46 and the width (the dimension in the x direction) that is approximately equal to the width of the fourth opening 46. As viewed in the z direction, the fourth opening 46, the additional opening 46a and the additional opening 46b enclose the fourth bond portion 44.

In the present embodiment again, when the molten bonding material flows out during the manufacturing process, the first opening 35, the additional opening 35a and the additional opening 35b prevent the bonding material from flowing to the first bond portion 33. This prevents the bonding material solidified into the bonding layer 69 from interfering with the bonding of the wire 62a. Moreover, when the sealing resin 7 separates from the first die pad 3, the first opening 35, the additional opening 35a and the additional opening 35b prevent such separation from spreading to the first bond portion 33. The second opening 36, the additional opening 35a and the additional opening 35b also prevent the bonding material from flowing to the second bond portions 34 and prevent separation of the sealing resin 7 from spreading to the second bond portions 34. The third opening 45, the additional opening 45a and the additional opening 45b also prevent the bonding material from flowing to the third bond portion 43 and prevent separation of the sealing resin 7 from spreading to the third bond portion 43. The fourth opening 46, the additional opening 46a and the additional opening 46b also prevent the bonding material from flowing to the fourth bond portion 44 and prevent separation of the sealing resin 7 from spreading to the fourth bond portion 44. The semiconductor device A60 has a configuration similar to the semiconductor device A10 and hence has the same advantages as the semiconductor device A10. In addition, because each opening 35, 36, 45, 46 is smaller in dimension in the x direction than those of the first embodiment, the first die pad 3 and the second die pad 4 can be made stronger. The additional openings prevent the bonding material from flowing in by circumventing the ends of each opening 35, 36, 45, 46 in the x direction and prevent the separation of the sealing resin 7 from spreading through the areas near such ends of the opening.

Figure 21:
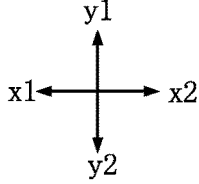
FIG. 21 is a plan view of a semiconductor device according to a seventh embodiment of the present disclosure, as seen through a sealing resin.

FIG. 21 is a view of a semiconductor device A70 according to a seventh embodiment of the present disclosure. FIG. 21 is a plan view of the semiconductor device A70 and corresponds to FIG. 2. In FIG. 21, the sealing resin 7 is illustrated as transparent, and the outline of the sealing resin 7 is shown by imaginary lines (two-dot chain lines) for convenience of understanding. The semiconductor device A70 of the present embodiment differs from the first embodiment in that the insulating element 13 is mounted on the second die pad 4.

In the present embodiment, the second die pad 4 is larger in dimension in the x direction than that of the first embodiment. On the other hand, the first die pad 3 is smaller in dimension in the x direction than that of the first embodiment. A pair of connecting portions 54 are connected to the second die pad 4 that is larger in dimension in the x direction. The connecting portions 54 have a shape similar to that of the connecting portions 56 of the first embodiment. On the other hand, a pair of connecting portions 56 are connected to the first die pad 3 that is smaller in dimension in the x direction. The connecting portions 56 have a shape similar to that of the connecting portions 54 of the first embodiment. That is, the shape of the conductive support member 2 of the present embodiment corresponds to the shape of the conductive support member 2 of the first embodiment as inverted in the x direction with respect to an axis along the y direction. In the present embodiment, the insulating element 13 is mounted on the second die pad 4.

In the present embodiment again, when the molten bonding material flows out during the manufacturing process, the first opening 35 prevents the bonding material from flowing to the first bond portion 33. This prevents the bonding material solidified into the bonding layer 69 from interfering with the bonding of the wire 62a. Moreover, when the sealing resin 7 separates from the first die pad 3, the first opening 35 prevents such separation from spreading to the first bond portion 33. The second opening 36, the third opening 45, and the fourth opening 46 act in the same manner. The semiconductor device A70 has a configuration similar to the semiconductor device A10 and hence has the same advantages as the semiconductor device A10.

The semiconductor device according to the present disclosure is not limited to the foregoing embodiments. The specific structure of each part of the semiconductor device according to the present disclosure can be varied in design in many ways. The present disclosure includes the embodiments described in the following clauses.

Clause 1

A semiconductor device comprising:
a first die pad including a first obverse surface facing in a thickness direction;
a second die pad spaced apart from the first die pad in a first direction orthogonal to the thickness direction and including a second obverse surface facing in the thickness direction;
a first semiconductor element mounted on the first obverse surface;
a second semiconductor element mounted on the second obverse surface;
an insulating element mounted on the first obverse surface or the second obverse surface and located between the first semiconductor element and the second semiconductor element in the first direction, the insulating element being configured to provide electrical insulation between the first semiconductor element and the second semiconductor element while relaying a signal between the first semiconductor element and the second semiconductor element;
a first wire bonded to the first semiconductor element and the first obverse surface; and a sealing resin covering the first semiconductor element, the second semiconductor element and the insulating element,
wherein the first die pad includes:
a first bond portion located on a first side of the first semiconductor element in a second direction orthogonal to the thickness direction and the first direction, the first wire being bonded to the first bond portion; and
a first opening located between the first bond portion and the first semiconductor element in the second direction and including an opening end in the first obverse surface.

Clause 2

The semiconductor device according to clause 1, wherein the second semiconductor element is a control element, and the first semiconductor element is a drive element that receives a signal from the control element via the insulating element and generates and outputs a drive signal.

Clause 3

The semiconductor device according to clause 1 or 2, further comprising:
a plurality of terminals which are arranged along the second direction and at least one of which is electrically connected to the first semiconductor element; and
a pair of connecting portions, wherein
the plurality of terminals include a pair of outer terminals located at opposite ends in the second direction, and
each of the pair of connecting portions is connected to one of the pair of outer terminals and the first die pad.

Clause 4

The semiconductor device according to clause 3, wherein each of the pair of connecting portions includes:
a first coupling section and a second coupling section that are connected to the first die pad; and
a joint section connected to one of the pair of outer terminals, the first coupling section, and the second coupling section,
the first coupling section extends in the second direction from the first die pad to the joint section,
the second coupling section includes a first part and a second part, the first part extending in the second direction from the first die pad, the second part being connected to the first part and the joint section and extending in a direction inclined with respect to the second direction, and
the joint section includes a through-hole penetrating in the thickness direction.

Clause 5

The semiconductor device according to any one of clauses 1 to 4, wherein the first opening extends in the first direction.

Clause 6

The semiconductor device according to any one of clauses 1 to 5, wherein the first opening overlaps with an entirety of the first semiconductor element as viewed in the second direction.

Clause 7

The semiconductor device according to any one of clauses 1 to 6, wherein opposite ends of the first opening in the first direction are located inward from an outer edge of the first obverse surface as viewed in the thickness direction.

Clause 8

The semiconductor device according to any one of clauses 1 to 7, wherein the first opening has a dimension of not less than 100 μm and not more than 250 μm in the second direction.

Clause 9

The semiconductor device according to any one of clauses 1 to 8, wherein, in the second direction, a first distance between the first opening and the first semiconductor element is greater than a second distance between the first opening and the first bond portion.

Clause 10

The semiconductor device according to any one of clauses 1 to 9, wherein the first opening is a groove recessed from the first obverse surface in the thickness direction.

Clause 11

The semiconductor device according to any one of clauses 1 to 9, wherein the first opening penetrates the first die pad in the thickness direction.

Clause 12

The semiconductor device according to any one of clauses 1 to 11, further comprising a second wire bonded to the first semiconductor element and the first obverse surface,
wherein the first die pad includes:
a second bond portion which is located on a second side of the first semiconductor element in the second direction and to which the second wire is bonded; and
a second opening located between the second bond portion and the first semiconductor element in the second direction and including an opening end in the first obverse surface.

Clause 13

The semiconductor device according to any one of clauses 1 to 12, further comprising a third wire bonded to the second semiconductor element and the second obverse surface,
wherein the second die pad includes:
a third bond portion which is located on the first side of the second semiconductor element in the second direction and to which the third wire is bonded; and
a third opening located between the third bond portion and the second semiconductor element in the second direction and including an opening end in the second obverse surface.

Clause 14

The semiconductor device according to clause 13, wherein the third opening extends in the first direction.

Clause 15

The semiconductor device according to clause 13 or 14, wherein the third opening overlaps with an entirety of the second semiconductor element as viewed in the second direction.

Clause 16

The semiconductor device according to any one of clauses 13 to 15, wherein opposite ends of the third opening in the first direction are located inward from an outer edge of the second obverse surface as viewed in the thickness direction.

Clause 17

The semiconductor device according to any one of clauses 13 to 16, further comprising a fourth wire bonded to the second semiconductor element and the second obverse surface,
wherein the second die pad includes:
a fourth bond portion which is located on the second side of the second semiconductor element in the second direction and to which the fourth wire is bonded; and
a fourth opening located between the fourth bond portion and the second semiconductor element in the second direction and including an opening end in the second obverse surface.

Clause 18

The semiconductor device according to any one of clauses 1 to 17, further comprising a bonding layer interposed between the first die pad and the first semiconductor element,
wherein the bonding layer is Ag paste.

Clause 19

The semiconductor device according to any one of clauses 1 to 18, wherein the insulating element is mounted on the first obverse surface.

---

REFERENCE NUMERALS

A10, A20, A30, A40, A50, A60, A70: Semiconductor device
11: First semiconductor element        11a: End surface
12: Second semiconductor element        13: Insulating element
13a: End surface        2: Conductive support member
3: First die pad        31: First obverse surface
31a, 31b: Outer edge        32: First reverse surface
33: First bond portion        34: Second bond portion
35: First opening        35a, 35b: Additional opening
36: Second opening        36a, 36b: Additional opening
37: Fifth opening        38: Sixth opening
4: Second die pad        41: Second obverse surface
42: Second reverse surface        43: Third bond portion
44: Fourth bond portion        45: Third opening
45a, 45b: Additional opening        46: Fourth opening
46a, 46b: Additional opening        51, 51a, 51b: Input-side terminal
53: Pad portion        54: Connecting portion
541: Coupling section        543: Joint section
543a: Through-hole        52, 52a, 52b: Output-side terminal
55: Pad portion        56: Connecting portion
561: First coupling section        562: Second coupling section
562a: First part        562b: Second part
563: Joint section        563a: Through-hole
61, 61a, 61b, 62, 62a, 62b, 63, 64: Wire
69: Bonding layer        7: Sealing resin
71: Top surface        72: Bottom surface
73: First side surface        731: First region -continued

| REFERENCE NUMERALS | |
|---|---|
| 732: Second region | 733: Third region |
| 74: Second side surface | 741: Fourth region |
| 742: Fifth region | 743: Sixth region |
| 75: Third side surface | 751: Seventh region |
| 752: Eighth region | 753: Ninth region |
| 76: Fourth side surface | 761: Tenth region |
| 762: Eleventh region | 763: Twelfth region |
| 81: Lead frame | 81A: Obverse surface |
| 81B: Reverse surface | 811: Outer frame |
| 812A: First die pad | 812B: Second die pad |
| 813: First lead | 814: Second lead |
| 815: Connecting portions | 816: Dam bar |

The invention claimed is:

1. A semiconductor device comprising:

a first die pad including a first obverse surface facing in a thickness direction;

a second die pad spaced apart from the first die pad in a first direction orthogonal to the thickness direction and including a second obverse surface facing in the thickness direction;

a first semiconductor element mounted on the first obverse surface, the first semiconductor element being smaller in area than the first obverse surface as viewed in the thickness direction;

a second semiconductor element mounted on the second obverse surface, the second semiconductor element being smaller in area than the second obverse surface as viewed in the thickness direction;

an insulating element mounted on the first obverse surface or the second obverse surface and located between the first semiconductor element and the second semiconductor element in the first direction, the insulating element being configured to provide electrical insulation between the first semiconductor element and the second semiconductor element while relaying a signal between the first semiconductor element and the second semiconductor element;

a first wire having a first end and a second end opposite to the first end, the first wire being bonded to the first semiconductor element at the first end and to the first obverse surface at the second end; and a sealing resin covering the first semiconductor element, the second semiconductor element and the insulating element, wherein the first die pad includes:

a first bond portion located to be offset to a first side of a second direction orthogonal to the thickness direction and the first direction with respect to the first semiconductor element, the second end of the first wire being bonded to the first bond portion; and a first opening located between the first bond portion and the first semiconductor element in the second direction and including an opening end in the first obverse surface.

2. The semiconductor device according to claim 1, wherein the second semiconductor element is a control element, and the first semiconductor element is a drive element that receives a signal from the control element via the insulating element and generates and outputs a drive signal.

3. The semiconductor device according to claim 1, further comprising:

a plurality of terminals which are arranged along the second direction and at least one of which is electrically connected to the first semiconductor element; and a pair of connecting portions, wherein the plurality of terminals include a pair of outer terminals located at opposite ends in the second direction, and each of the pair of connecting portions is connected to one of the pair of outer terminals and the first die pad.

4. The semiconductor device according to claim 3, wherein each of the pair of connecting portions includes:

a first coupling section and a second coupling section that are connected to the first die pad; and a joint section connected to one of the pair of outer terminals, the first coupling section, and the second coupling section, the first coupling section extends in the second direction from the first die pad to the joint section, the second coupling section includes a first part and a second part, the first part extending in the second direction from the first die pad, the second part being connected to the first part and the joint section and extending in a direction inclined with respect to the second direction, and the joint section includes a through-hole penetrating in the thickness direction.

5. The semiconductor device according to claim 1, wherein the first opening extends in the first direction.

6. The semiconductor device according to claim 1, wherein the first opening overlaps with an entirety of the first semiconductor element as viewed in the second direction.

7. The semiconductor device according to claim 1, wherein opposite ends of the first opening in the first direction are located inward from an outer edge of the first obverse surface as viewed in the thickness direction.

8. The semiconductor device according to claim 1, wherein the first opening has a dimension of not less than 100 μm and not more than 250 μm in the second direction.

9. The semiconductor device according to claim 1, wherein, in the second direction, a first distance between the first opening and the first semiconductor element is greater than a second distance between the first opening and the first bond portion.

10. The semiconductor device according to claim 1, wherein the first opening is a groove recessed from the first obverse surface in the thickness direction.

11. The semiconductor device according to claim 1, wherein the first opening penetrates the first die pad in the thickness direction.

12. The semiconductor device according to claim 1, further comprising a second wire bonded to the first semiconductor element and the first obverse surface, wherein the first die pad includes:

a second bond portion which is located to be offset to a second side of the second direction with respect to the first semiconductor element, the second wire having an end bonded to the second bond portion; and a second opening located between the second bond portion and the first semiconductor element in the second direction and including an opening end in the first obverse surface.

13. The semiconductor device according to claim 1, further comprising a third wire bonded to the second semiconductor element and the second obverse surface, wherein the second die pad includes:

a third bond portion which is located to be offset to the first side of the second direction with respect to the second semiconductor element, the third wire having an end bonded to the third bond portion; and a third opening located between the third bond portion and the second semiconductor element in the second direction and including an opening end in the second obverse surface.

14. The semiconductor device according to claim 13, wherein the third opening extends in the first direction.

15. The semiconductor device according to claim 13, wherein the third opening overlaps with an entirety of the second semiconductor element as viewed in the second direction.

16. The semiconductor device according to claim 13, wherein opposite ends of the third opening in the first direction are located inward from an outer edge of the second obverse surface as viewed in the thickness direction.

17. The semiconductor device according to claim 13, further comprising a fourth wire bonded to the second semiconductor element and the second obverse surface, wherein the second die pad includes:

a fourth bond portion which is located to be offset to the second side of the second direction with respect to the second semiconductor element, the fourth wire having an end bonded to the fourth bond portion; and a fourth opening located between the fourth bond portion and the second semiconductor element in the second direction and including an opening end in the second obverse surface.

18. The semiconductor device according to claim 1, further comprising a bonding layer interposed between the first die pad and the first semiconductor element, wherein the bonding layer is Ag paste.

19. The semiconductor device according to claim 1, wherein the insulating element is mounted on the first obverse surface.

20. The semiconductor device according to claim 1, wherein the first opening is an elongated linear slit as viewed in the thickness direction.

* * * * *